US010269917B2

United States Patent
Chen et al.

(10) Patent No.: US 10,269,917 B2
(45) Date of Patent: Apr. 23, 2019

(54) METHOD OF FORMING A FINFET WITH WORK FUNCTION TUNING LAYERS HAVING STAIR-STEP INCREMENT SIDEWALLS

(71) Applicant: Taiwan Semiconductor Manufacturing Company, Ltd., Hsin-Chu (TW)

(72) Inventors: Yi-Chun Chen, Hsin-Chu (TW); Tsung Fan Yin, Hsin-Chu (TW); Li-Te Hsu, Shanhua Township (TW); Ying Ting Hsia, Kaohsiung (TW); Yi-Wei Chiu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/297,850

(22) Filed: Oct. 19, 2016

(65) Prior Publication Data

US 2018/0108748 A1 Apr. 19, 2018

(51) Int. Cl.
| | |
|---|---|
| *H01L 29/49* | (2006.01) |
| *H01L 29/66* | (2006.01) |
| *H01L 21/28* | (2006.01) |
| *H01L 29/78* | (2006.01) |

(52) U.S. Cl.
CPC .... *H01L 29/4966* (2013.01); *H01L 21/28088* (2013.01); *H01L 29/66545* (2013.01); *H01L 29/66795* (2013.01); *H01L 29/785* (2013.01)

(58) Field of Classification Search
CPC .......... H01L 21/28088; H01L 29/4966; H01L 29/42376; H01L 29/66545; H01L 29/66795; H01L 29/7851
See application file for complete search history.

(56) References Cited

U.S. PATENT DOCUMENTS

| | | | |
|---|---|---|---|
| 9,196,612 B2* | 11/2015 | Basker | H01L 27/0883 |
| 2016/0093535 A1* | 3/2016 | Xu | H01L 21/02244 |
| | | | 257/392 |

* cited by examiner

*Primary Examiner* — Andrew Q Tran
(74) *Attorney, Agent, or Firm* — Slater Matsil, LLP

(57) ABSTRACT

A method of forming a gate structure includes forming an opening through an insulating layer and forming a first work function metal layer in the opening. The method also includes recessing the first work function metal layer into the opening to form a recessed first work function metal layer, and forming a second work function metal layer in the opening and over the first work function metal layer. The second work function metal layer lines and overhangs the recessed first work function metal layer.

20 Claims, 32 Drawing Sheets

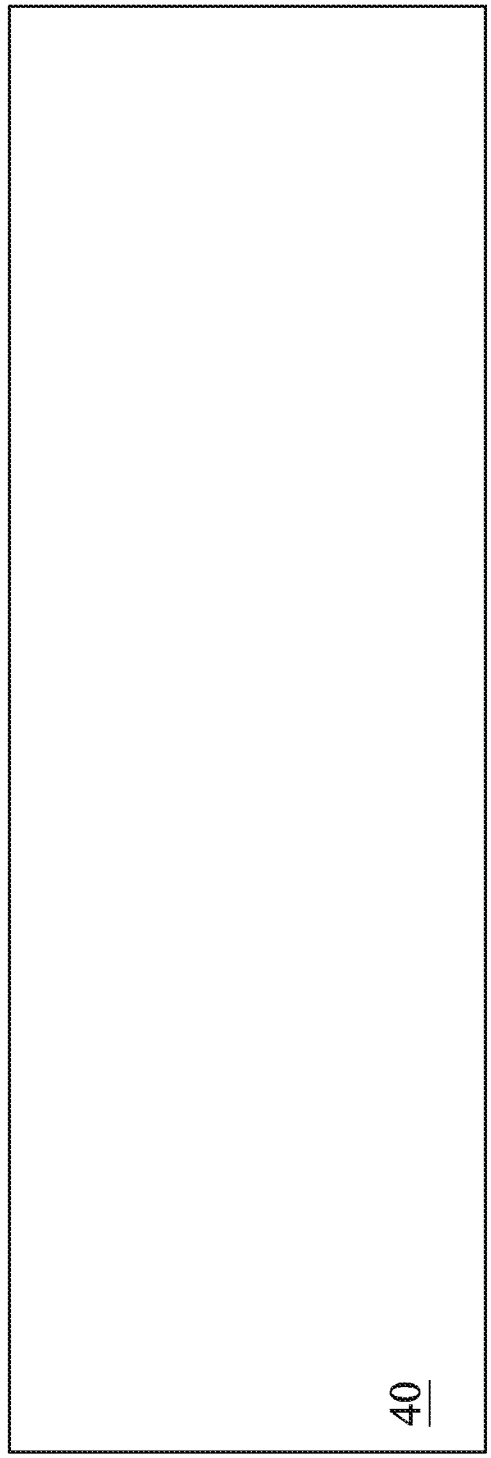

METHOD OF FORMING A FINFET WITH WORK FUNCTION TUNING LAYERS HAVING STAIR-STEP INCREMENT SIDEWALLS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a FinFET, which is a transistor structure that includes a fin-shaped semiconductor material that is raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5 through 22, and 24 through 26 are cross-sectional views of intermediate stages in the manufacturing of finFETs, in accordance with some embodiments.

DETAILED DESCRIPTION

Figure 1:
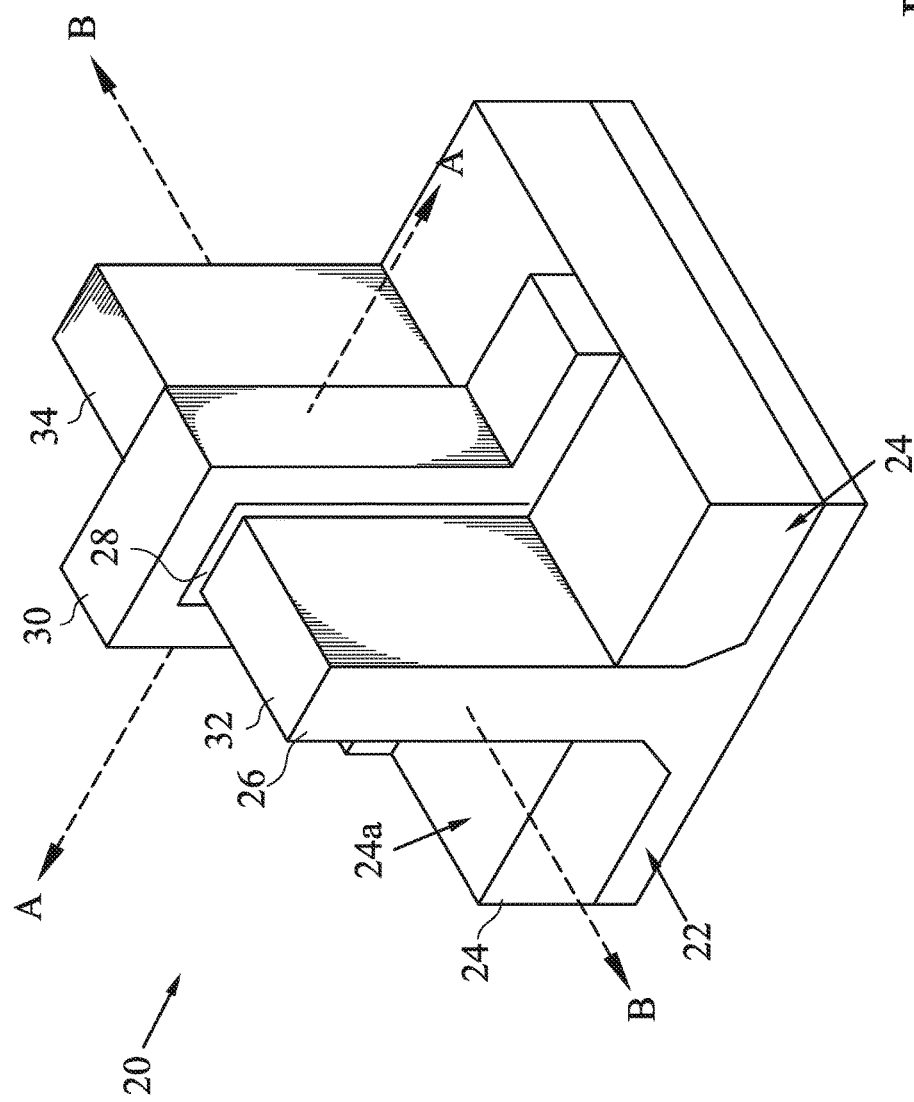
FIG. 1 is an example of a generic fin Field-Effect Transistor (finFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (finFETs) and planar transistors and methods of forming the same are provided in accordance with various embodiments. Intermediate stages of forming finFETs are illustrated. Some embodiments discussed herein are discussed in the context of finFETs formed using a gate-last process. Some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Some embodiments may achieve advantages. By forming work function tuning layers that have sidewalls with stair-step-like increments, voids, caused when openings are filled with conductive material, are avoided or substantially reduced. As such, the stair-step-like increments of work function tuning layers allow for a uniform filling of the openings when a conductive material (e.g. that forms a gate structure) is deposited into the openings. Furthermore, since voids may be avoided or substantially reduced, damage to a channel region (e.g. in a fin) may be avoided or substantially reduced during an etch back of the conductive material.

FIG. 1 illustrates a finFET 20 in a three-dimensional view, according to an embodiment. The finFET 20 includes a fin 26 on a substrate 22. The finFET 20 also includes isolation regions 24. The fin 26 protrudes from the substrate 22 and extends out of a plane formed by a major surface 24a of the isolation regions 24. In the example of FIG. 1, the fin 26 also extends between neighboring isolation regions 24. A gate dielectric 28 lines a portion of the fin 26 (e.g. a portion of the sidewalls of the fin 26). The gate dielectric 28 is also formed over a top surface of the fin 26 (e.g. a surface of the fin 26 that is farthest from and directed away from the substrate 22). A gate electrode 30 is disposed over the gate dielectric 28 and may also covers a portion of the major surface 24a of the isolation regions 24. Portions of the fin 26 that are not covered by the gate dielectric 28 or the gate electrode 30 may form source/drain regions 32 and 34. As shown in FIG. 1, source/drain regions 32 and 34 are disposed at opposite sides of the fin 26 with respect to the gate dielectric 28 and gate electrode 30. FIG. 1 further illustrates reference cross-sections that are used in later figures. Cross-section A-A is across a channel, the gate dielectric 28, and the gate electrode 30 of the finFET 20. In some embodiments, cross-section A-A is along a transverse axis of the fin 26. Cross-section B-B is perpendicular to cross-section A-A and is along a longitudinal axis of the fin 26 and in a direction of, for example, a current flow between the source/drain regions 32 and 34. Subsequent figures refer to these reference cross-sections for clarity.

Figure 3A:
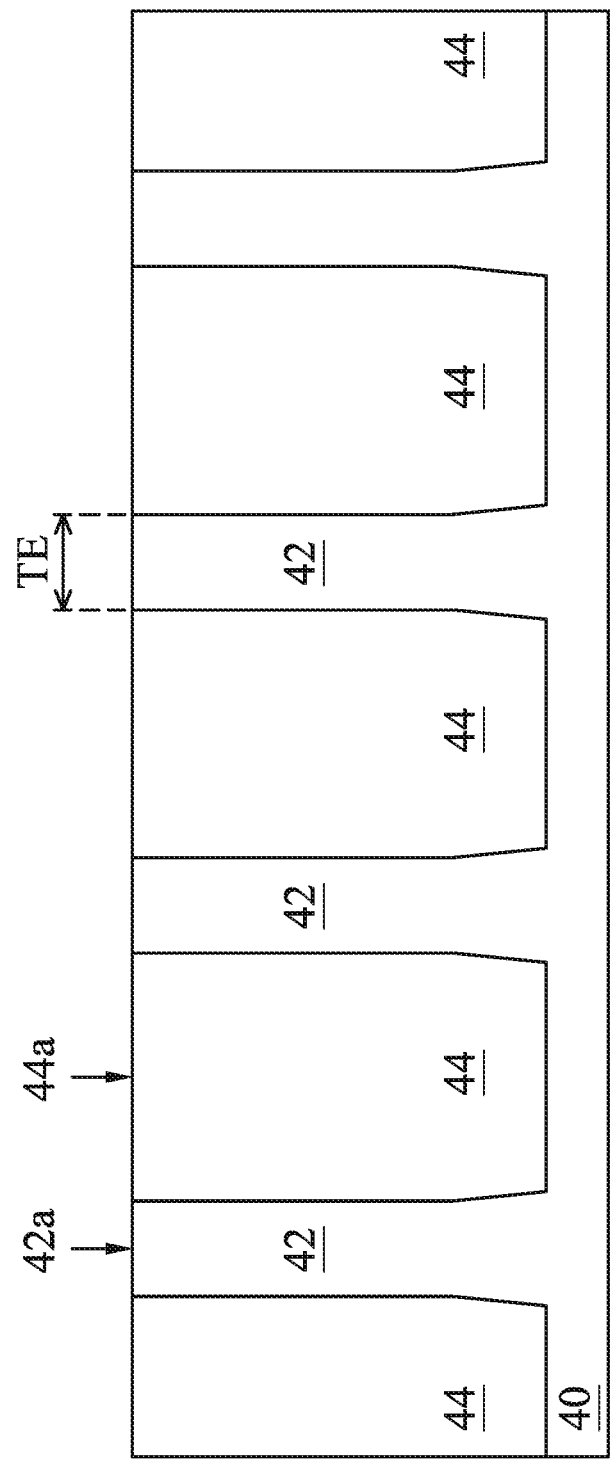

FIGS. 2 through 26 are cross-sectional views of intermediate stages in the manufacturing of finFETs, according to an embodiment. FIGS. 2, 3A, and 4A illustrate reference cross-section A-A illustrated in FIG. 1, except for multiple fins. FIGS. 3B, 4B, and 5 through 26 illustrate reference cross-section B-B illustrated in FIG. 1, except for multiple finFETs.

FIG. 2 illustrates a substrate 40. The substrate 40, which may be identified with substrate 22 in FIG. 1, may be a semiconductor substrate, such as a bulk semiconductor substrate, a semiconductor-on-insulator (SOI) substrate, a multi-layered or gradient substrate, or the like. The substrate 40 may include a semiconductor material, such as an elemental semiconductor including Si and Ge; a compound or alloy semiconductor including at least one of SiC, SiGe, GaAs, GaP, GaAsP, AlInAs, AlGaAs, GaInAs, InAs, GaInP, InP, InSb, or GaInAsP; or a combination thereof. The substrate 40 may be doped or un-doped. In a specific example, the substrate 40 is a bulk silicon substrate.

Figure 3B:
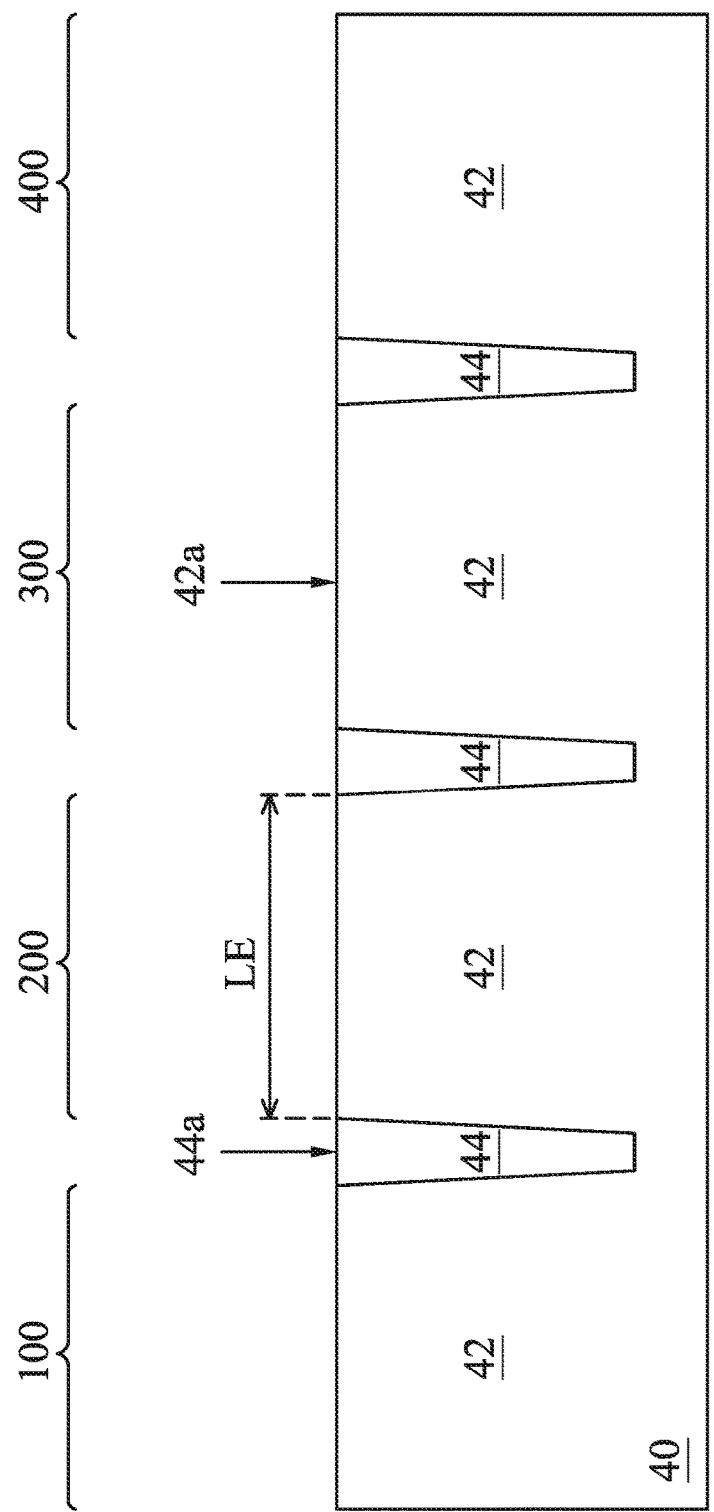
Figure 4A:
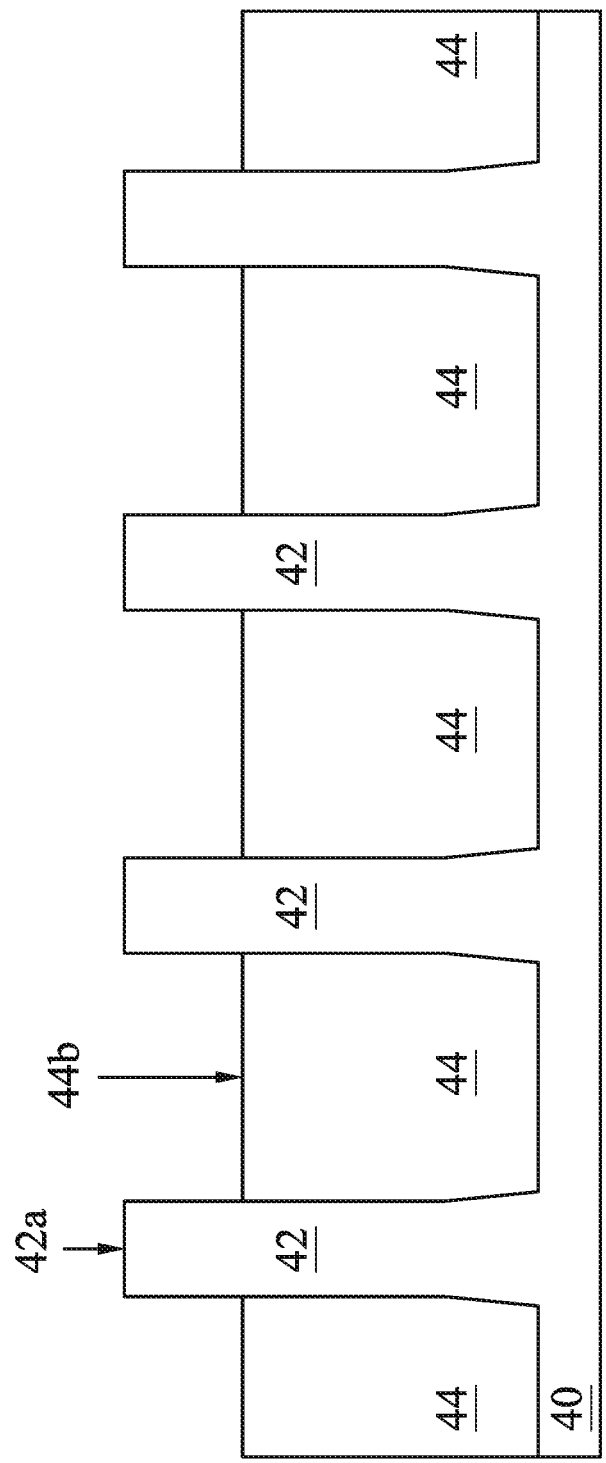

FIGS. 3A and 3B illustrate the formation of fins 42 and isolation regions 44, in accordance with an embodiment. Each of the fins 42 shown in FIGS. 3A and 3B may be, or may be an intermediate stage in the manufacturing of, the fin 26 shown in FIG. 1. Similarly, the isolation regions 44 shown in FIGS. 3A and 3B may be, or may be an intermediate stage in the manufacturing of, the isolation 24 regions shown in FIG. 1. In FIGS. 3A and 3B, the fins 42 are formed from and protrude out of the substrate 40. In some embodiments, the fins 42 may be formed by etching trenches in the substrate 40. The etching may be any acceptable etch process, such as a reactive ion etch (RIE), neutral beam etch (NBE), the like, or a combination thereof. The etch may be anisotropic. As shown in FIGS. 3A and 3B, each of the fins 42 may have a transverse extent TE (e.g. a fin thickness, measured along the transverse axis of the fins 42) and a longitudinal extent LE (e.g. a fin length, measured along the longitudinal axis of the fins 42).

Further in FIGS. 3A and 3B, an insulation material is formed between neighboring fins 42 to form the isolation regions 44. The insulation material may be an oxide, such as silicon oxide, a nitride, the like, or a combination thereof, and may be formed by a high density plasma chemical vapor deposition (HDP-CVD), a flowable CVD (FCVD) (e.g. a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed.

Further in FIGS. 3A and 3B, a planarization process, such as a chemical mechanical polish (CMP), may remove any excess insulation material formed over top surfaces 42a of the fins 42. As shown in the example of FIGS. 3A and 3B, the planarization process may result in top surfaces 44a of the isolation regions 44 and top surfaces 42a of the fins 42 being co-planar, within process variations. The top surfaces 42a of the fins 42 may be major surfaces of the fins 42 farthest from and directed away from substrate 40. Similarly, the top surfaces 44a of the isolation regions 44 may be major surfaces of the isolation regions 44 farthest from and directed away from substrate 40.

Although not specifically illustrated, appropriate wells may be formed in at least one of the fins 42 or the substrate 40. For example, a p-well may be formed in a first region 100 and a second region 200 of the substrate 40 (illustrated in FIG. 3B and subsequent figures) where n-type devices, such as n-type finFETs, are to be formed, while an n-well may be formed in a third region 300 and a fourth region 400 of the substrate 40 (illustrated in FIG. 3B and subsequent figures) where p-type devices, such as p-type finFETs, are to be formed.

For example, to form a p-well in the first region 100 and the second region 200, a photoresist may be formed over the fins 42 and the isolation regions 44 in the first region 100, second region 200, third region 300, and fourth region 400. The photoresist may subsequently be patterned to expose the first region 100 and the second region 200 of the substrate 40, while leaving the third region 300 and the fourth region 400 covered by the photoresist. The photoresist may be formed by using a spin-on technique and may be patterned using acceptable photolithography techniques. Once the photoresist is patterned, a p-type impurity implant may be performed in the first region 100 and the second region 200, with the photoresist acting as a mask to substantially prevent p-type impurities from being implanted into the third region 300 and the fourth region 400. The p-type impurities may be boron, $BF_2$, or the like implanted in the first region 100 and the second region 200 to a concentration of equal to or less than $10^{18}$ cm$^{-3}$, such as between about $10^{17}$ cm$^{-3}$ and about $10^{18}$ cm$^{-3}$. After the implantation, the photoresist may be removed, such as by an acceptable ashing process, for example.

Further, to form an n-well in the third region 300 and the fourth region 400, a photoresist may be formed over the fins 42 and the isolation regions 44 in the first region 100, second region 200, third region 300, and fourth region 400. The photoresist may be patterned to expose the third region 300 and the fourth region 400 of the substrate 40, while leaving the first region 100 and the second region 200 covered by the photoresist. The photoresist may be formed by using a spin-on technique and may be patterned using acceptable photolithography techniques. Once the photoresist is patterned, an n-type impurity implant may be performed in the third region 300 and the fourth region 400, with the photoresist acting as a mask to substantially prevent n-type impurities from being implanted into the first region 100 and the second region 200. The n-type impurities may be phosphorus, arsenic, or the like implanted in the third region 300 and the fourth region 400 to a concentration of equal to or less than $10^{18}$ cm$^{-3}$, such as between about $10^{17}$ cm$^{-3}$ and about $10^{18}$ cm$^{-3}$. After the implantation, the photoresist may be removed, such as by an acceptable ashing process, for example.

After the implantation of the p-type and n-type impurities, an anneal may be performed to activate the p-type and n-type impurities that were implanted. The annealed implantations may form a p-well in the first region 100 and the second region 200, and an n-well in the third region 300 and the fourth region 400.

Figure 4B:
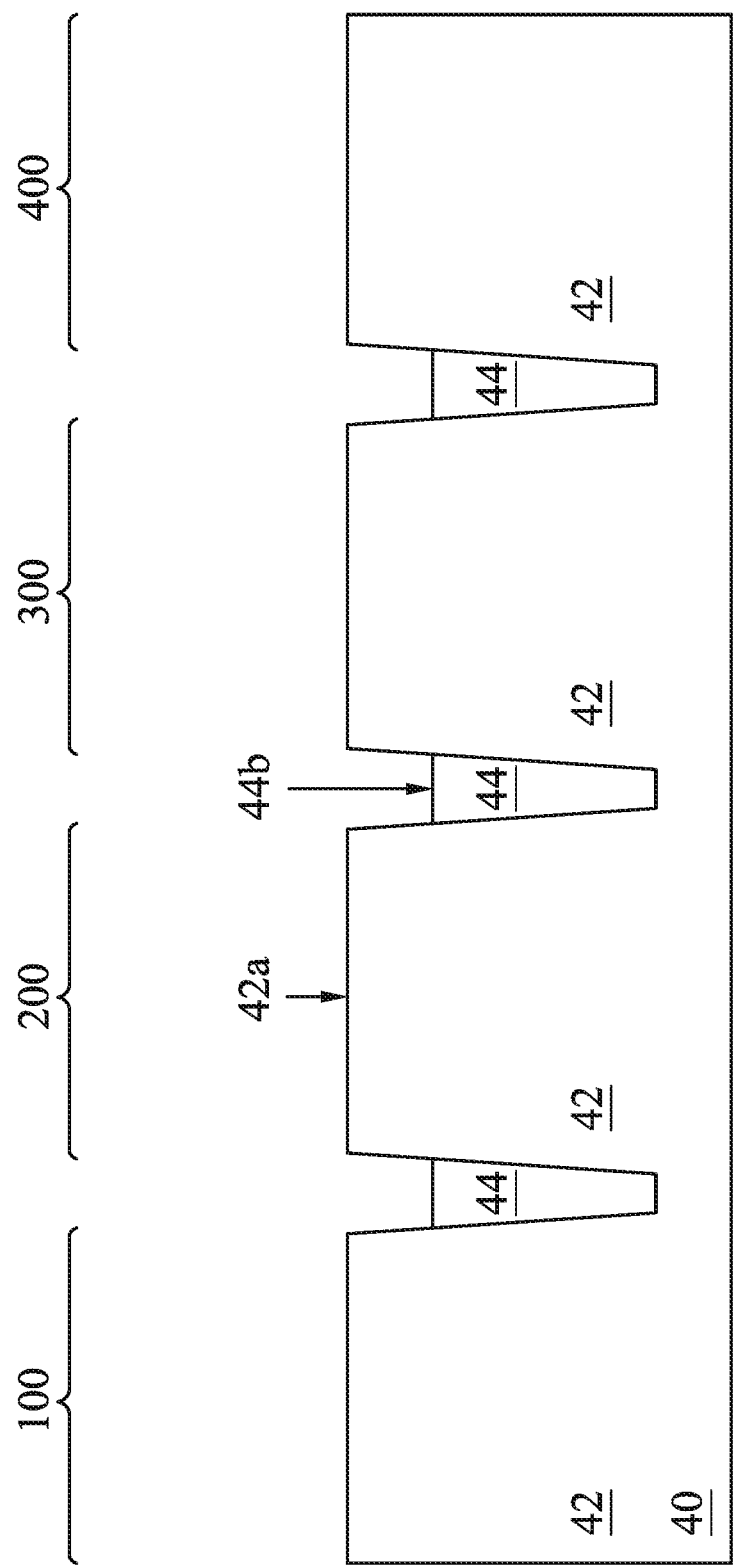

Referring to FIGS. 4A and 4B, the isolation regions 44 may be recessed to form shallow trench isolation (STI) regions. As an example, the top surfaces 44a of the isolation regions 44 shown in FIGS. 3A and 3B may be recessed to form top surfaces 44b shown in FIGS. 4A and 4B. The isolation regions 44 are recessed such that the fins 42 protrude out of a plane formed by the top surfaces 44b of the isolation regions 44. The top surfaces 44b of the isolation regions 44 may be major surfaces of the isolation regions 44 farthest from and directed away from the substrate 40. The fins 42 also extend between neighboring isolation regions 44. The isolation regions 44 may be recessed using an acceptable etching process, such as one that is selective to the material of the isolation regions 44. In other words, the etch may consume or remove material of the isolation regions 44, while leaving material of the fins 42 substantially unperturbed. For example, a chemical oxide removal may be used to recess the isolation regions 44.

The process described with respect to FIGS. 2, 3A, 3B, 4A, and 4B is just one example of how the fins 42 and the isolation regions 44 may be formed. In other embodiments, a dielectric layer may be formed over a major surface of the substrate 40 shown in FIG. 2; trenches may be etched through the dielectric layer; epitaxial fins may be epitaxially grown in the trenches; and the dielectric layer may be recessed such that the homoepitaxial and/or heteroepitaxial structures protrude from the dielectric layer to form epitaxial fins. It may be advantageous to epitaxially grow a material or epitaxial fin structure for n-type finFETs different from the material or epitaxial fin structure for p-type finFETs.

Figure 5:
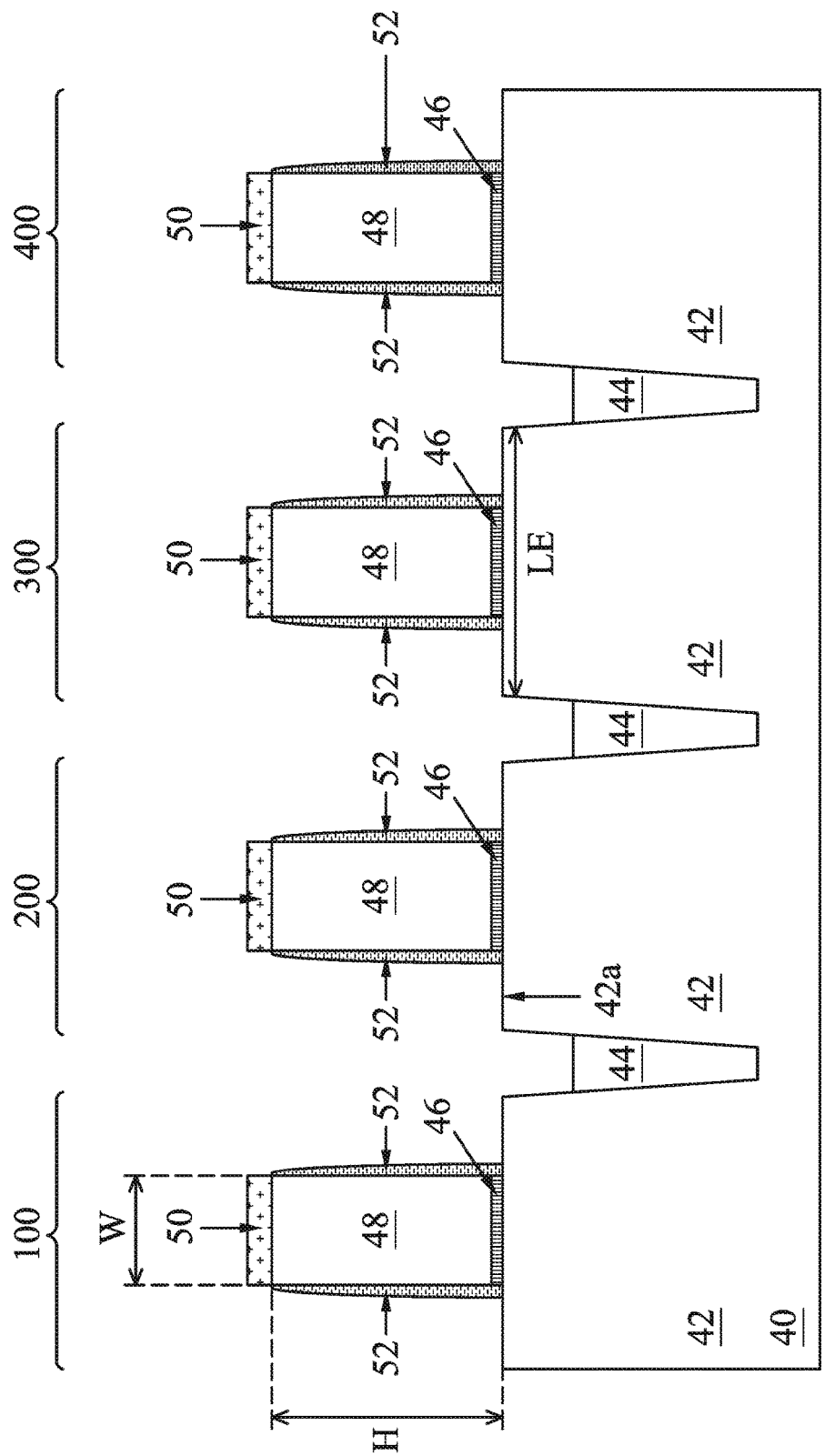

Referring to FIG. 5, dummy gate dielectrics 46, dummy gates 48, and gate spacers 52 that line sidewalls of the dummy gates 48 may be formed over the fins 42 (e.g. over a portion of the longitudinal extent LE of each fin 42). In forming the dummy gate dielectrics 46, the dummy gates 48, and the gate spacers 52, a dummy dielectric layer may be initially formed over the fins 42. The dummy dielectric layer may be, for example, silicon oxide, silicon nitride, a combination thereof, or the like, and may be deposited or thermally grown according to acceptable techniques, such as CVD, thermal oxidation, or the like. A dummy gate layer is subsequently formed over the dummy dielectric layer, and a mask layer is formed over the dummy gate layer. The dummy gate layer may be deposited, such as by using CVD or the like, over the dummy dielectric layer and then planarized, such as by a CMP. The mask layer may be deposited, such as by using CVD or the like, over the dummy gate layer. The dummy gate layer may include, for example, polysilicon, although other materials that have a high etching selectivity may also be used. The mask layer may include, for example, silicon nitride, silicon oxynitride, silicon carbon nitride, or the like.

Further in FIG. 5, the mask layer may be patterned using acceptable photolithography and etching techniques to form masks 50. The pattern of the masks 50 then may be transferred to the dummy gate layer and dummy dielectric layer by an acceptable etching technique to form the dummy gates 48 and the dummy gate dielectrics 46 from the dummy gate layer and the dummy dielectric layer, respectively. The etching may include an acceptable anisotropic etching, such as RIE, NBE, or the like. A width W of each of the dummy gates 48 and the dummy gate dielectrics 46 may be in range from about 10 nm to about 300 nm, such as about 16 nm. Each stack of the dummy gate 48 and the dummy gate dielectric 46 for a respective fin 42 has a combined height H. The height H may be in range from about 40 nm to about 100 nm, such as about 70 nm. An aspect ratio of the height to width W may be in a range from about 0.1 to about 10, such as about 6. The dummy gates 48 cover respective channel regions of the fins 42. The dummy gates 48 may also have a lengthwise direction (which is substantially perpendicular to the longitudinal extent LE of each fin 42) that covers the transverse extent TE of each fin 42.

Although not specifically illustrated, implants for lightly doped source/drain (LDD) regions may be performed. Similar to the implants discussed above in respect of FIGS. 3A and 3B, a mask, such as a photoresist, may be formed over the third region 300 and the fourth region 400 while exposing the first region 100 and the second region 200, and n-type impurities may be implanted into the exposed fins 42 in the first region 100 and the second region 200. The mask may then be removed. Subsequently, a mask, such as a photoresist, may be formed over the first region 100 and the second region 200 while exposing the third region 300 and the fourth region 400, and p-type impurities may be implanted into the exposed fins 42 in the third region 300 and the fourth region 400. The mask may then be removed. The n-type impurities may be any of, or any combination of, the n-type impurities previously discussed, and the p-type impurities may be any of, or any combination of, the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIG. 5, gate spacers 52 are formed along sidewalls of the dummy gates 48 and the dummy gate dielectrics 46. The gate spacers 52 may be formed by depositing (e.g. conformally depositing), such as by CVD or the like, a material and subsequently anisotropically etching the material. The material of the gate spacers 52 may be silicon nitride, silicon carbon nitride, a combination thereof, or the like.

Figure 6:
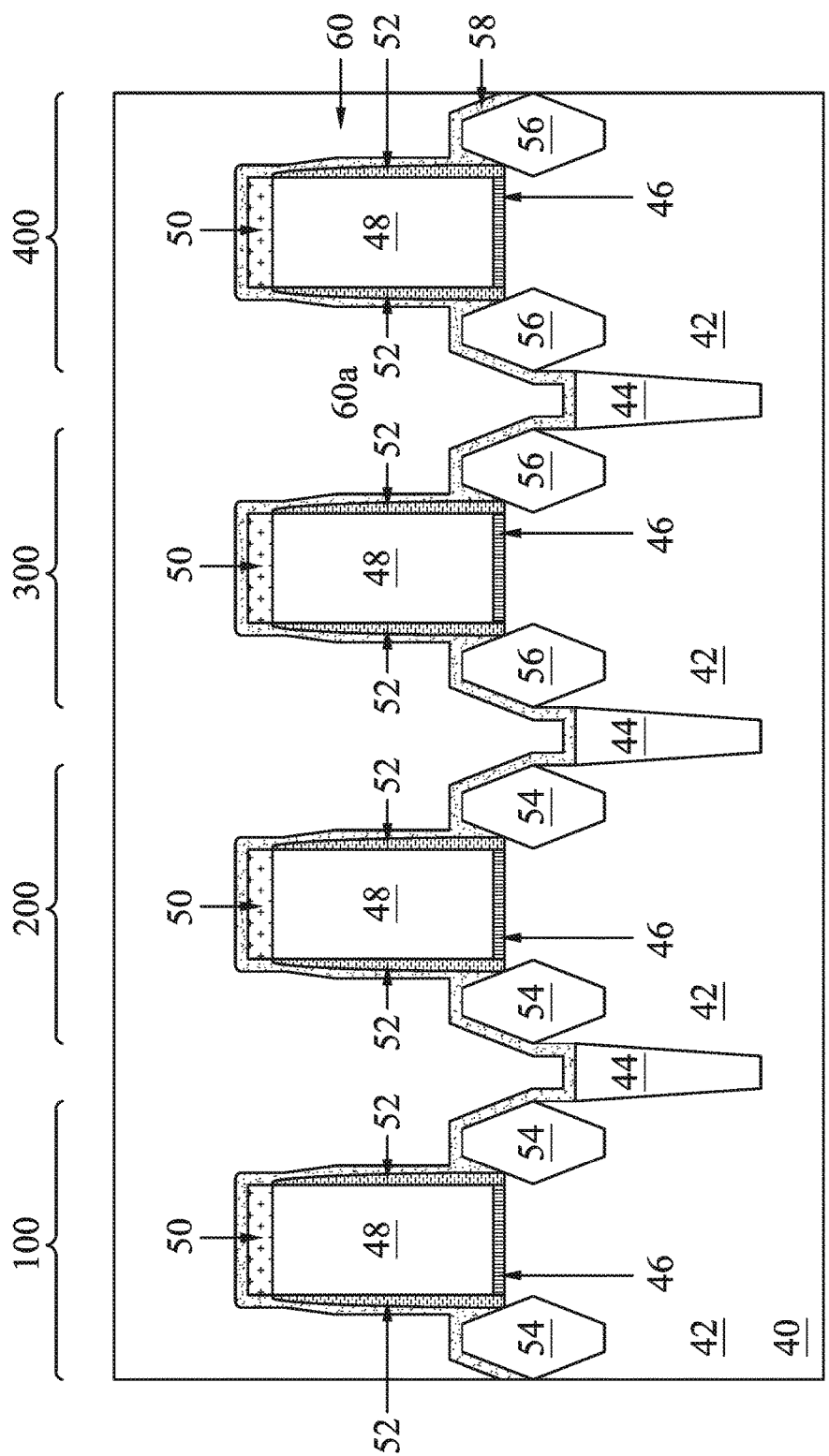

Referring to FIG. 6, epitaxial source/drain regions 54 and 56 may be formed in the source/drain region of the fins 42. In the first region 100 and the second region 200, epitaxial source/drain regions 54 are formed in the source/drain regions of the fins 42 such that each dummy gate 48 of a respective fin 42 is disposed between ones of a respective pair of the epitaxial source/drain regions 54. In the third region 300 and the fourth region 400, epitaxial source/drain regions 56 are formed in the source/drain regions of the fins 42 such that each dummy gate 48 of a respective fin 42 is disposed between ones of a respective pair of the epitaxial source/drain regions 54.

The epitaxial source/drain regions 54 in the first region 100 and the second region 200 (which may be used for n-type devices) may be formed by masking, such as with a hard mask, the third region 300 and the fourth region 400. Then, source/drain regions of the fins 42 in the first region 100 and the second region 200 are etched to form recesses. The etch may be any appropriate etch selective to the fins 42 and may be anisotropic. The epitaxial source/drain regions 54 in the first region 100 and the second region 200 are then epitaxially grown in the recesses. The epitaxial growth may be by using Metal-Organic CVD (MOCVD), Molecular Beam Epitaxy (MBE), Liquid Phase Epitaxy (LPE), Vapor Phase Epitaxy (VPE), the like, or a combination thereof. The epitaxial source/drain regions 54 may include any acceptable material, such as appropriate for n-type finFETs. For example, the epitaxial source/drain regions 54 may include silicon, SiC, SiCP, SiP, or the like. The epitaxial source/drain regions 54 may have surfaces raised from respective outer surfaces of the fins 42 and may have facets. The mask may then be removed, such as by using an etch process that is selective to the material of the mask.

The epitaxial source/drain regions 56 in the third region 300 and the fourth region 400 (which may be used for p-type devices) may be formed by masking, such as with a hard mask, the first region 100 and the second region 200. Then, source/drain regions of the fins 42 in the third region 300 and the fourth region 400 are etched to form recesses. The etch may be any appropriate etch selective to the fins 42 and may be anisotropic. The epitaxial source/drain regions 56 in the third region 300 and the fourth region 400 are then epitaxially grown in the recesses. The epitaxial growth may be by using MOCVD, MBE, LPE, VPE, the like, or a combination thereof. The epitaxial source/drain regions 56 may include any acceptable material, such as appropriate for p-type finFETs. For example, the epitaxial source/drain regions 56 may include SiGe, SiGeB, Ge, GeSn, or the like. The epitaxial source/drain regions 56 may have surfaces raised from respective outer surfaces of the fins 42 and may have facets. The mask may then be removed, such as by using an etch process that is selective to the material of the mask.

The epitaxial source/drain regions 54 and 56 may be implanted with dopants, similar to the process previously discussed (e.g. in respect of FIG. 5) for forming lightly doped source/drain regions, followed by an anneal. The epitaxial source/drain regions 54 and 56 may have an impurity concentration of between about $10^{19}$ cm$^{-3}$ and about $10^{21}$ cm$^{-3}$. The n-type impurities for source/drain regions in the first region 100 and the second region 200 (e.g. for n-type devices) may be any of the n-type impurities previously discussed, and the p-type impurities for source/drain regions in the third region 300 and the fourth region 400 (e.g. for p-type devices) may be any of the p-type impurities previously discussed. In other embodiments, the epitaxial source/drain regions 54 and 56 may be in-situ doped during growth.

Further in FIG. 6, an etch stop layer (ESL) 58 is formed on epitaxial source/drain regions 54 and 56, gate spacers 52, masks 50, and isolation regions 44. In some embodiments, the ESL 58 may include silicon nitride, silicon carbonitride, or the like, formed using Atomic Layer Deposition (ALD), chemical vapor deposition (CVD), the like, or a combination thereof. A bottom inter-layer dielectric (ILD0) 60 is deposited over the ESL 58. ILD0 60 may be a dielectric layer closet to fins 42 and may include Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 7:
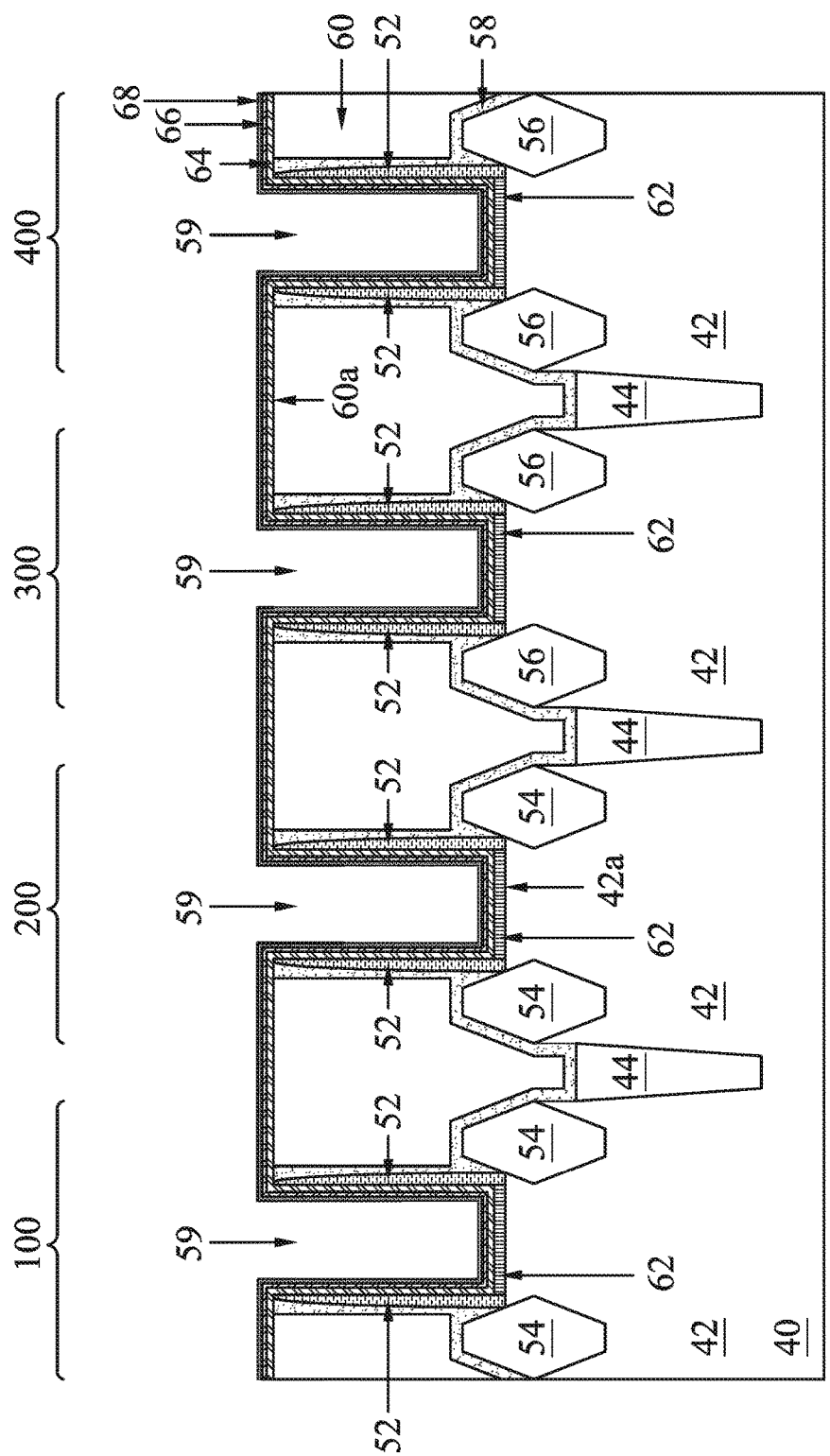

Referring to FIG. 7, a planarization process, such as a CMP, is performed to level a top surface 60a of ILD0 60 with the top surfaces of the dummy gates 48. The top surface 60a of ILD0 may be a major surface farthest from and directed away from the substrate 40. The CMP may also remove the masks 50 and the ESL 58 from over the dummy gates 48. Accordingly, top surfaces of the dummy gates 48 are exposed through the ILD0 60. The dummy gates 48 and the dummy gate dielectrics 46 are removed in one or more etching steps, so that recesses through the ILD0 60 and defined by the gate spacers 52 (e.g. inner sidewalls of the gate spacers 52) and the top surfaces 42a of the fins 42 are formed. Each of the recesses defined by the gate spacers 52 and the top surfaces 42a of the fins 42 may have an aspect ratio corresponding to the width W and height H discussed above with respect to FIG. 5 since the recesses are defined by the removal of the dummy gates 48 and dummy gate dielectrics 46. Each recess exposes a channel region of a respective fin 42. Each channel region is disposed between neighboring pairs of epitaxial source/drain regions 54 and 56 of a respective fin 42. The one or more etching steps may be selective to the materials of the dummy gates 48 and the dummy gate dielectrics 46, and may be a dry or wet etching. During the etching, the dummy gate dielectrics 46 may be used as an etch stop layer when the dummy gates 48 are etched. The dummy gate dielectric 46 may then be etched after the removal of the dummy gates 48. Although not specifically illustrated, depending on the similarity of materials used for the ILD0 60 and the dummy gate dielectrics 46, the ILD0 60 may be recessed or etched back when the dummy gate dielectrics 46 are removed, and this recessing may cause portions of at least one of the ESL 58 or the gate spacers 52 to protrude above the top surface 60a of the ILD0 60.

An interfacial dielectric 62 is formed in each recess and on the top surfaces 42a of the fins 42. The interfacial dielectric 62 may be, for example, an oxide or the like formed by thermal oxidation or the like. A thickness of the interfacial dielectric 62 may be in a range from about 10 Å to about 100 Å, such as about 40 Å. A gate dielectric layer 64 is then formed on the top surface of the ILD0 60 and in the recesses along sidewalls (e.g. inner sidewalls) of the gate spacers 52 and over the interfacial dielectric 62. In some embodiments, the gate dielectric layer 64 includes a high-k dielectric material, and in these embodiments, the gate dielectric layer 64 may have a k value greater than about 7.0, and may include a metal oxide or a silicate of Hf, Al, Zr, La, Mg, Ba, Ti, Pb, and combinations thereof. The gate dielectric layer 64 may be formed using ALD, CVD, Molecular-Beam Deposition (MBD), the like, or a combination thereof. A thickness of the gate dielectric layer 64 may be in a range from about 10 Å to about 100 Å, such as about 30 Å.

A capping layer is then formed on the gate dielectric layer 64. In the illustrated embodiment, the capping layer includes a first sub-layer 66 and a second sub-layer 68. In other embodiments, however, the capping layer may be a single layer or may include additional sub-layers. The capping layer may function as a barrier layer to prevent a subsequently deposited metal-containing material from diffusing into the gate dielectric layer 64 or ILD0 60. Further, the second sub-layer 68, as illustrated, may function as an etch stop during the formation of work function tuning layers (also referred to as "work function metal layers") in various regions 100, 200, 300 and 400 if the first sub-layer 66 is formed from a same material as the work function tuning layers, as will become clearer in the description that follows.

The first sub-layer 66 may include titanium nitride (TiN) or the like deposited on the gate dielectric layer 64 by ALD, CVD, or the like. The second sub-layer 68 may include tantalum nitride (TaN) or the like deposited on the first sub-layer 66 by ALD, CVD, or the like. A thickness of the capping layer may be in a range from about 5 Å to about 50 Å, such as about 10 Å. In the illustrated embodiment, a thickness of the first sub-layer 66 may be in a range from about 5 Å to about 50 Å, such as about 20 Å, while a thickness of the second sub-layer 68 may be in a range from about 5 Å to about 50 Å, such as about 20 Å. In the example shown in FIG. 7, openings 59 through the ILD0 60 and defined by the capping layer (e.g. the second sub-layer 68) are formed over each fin 42 as a result of forming the interfacial dielectric 62, the gate dielectric layer 64, and the capping layer (e.g. first sub-layer 66 and second sub-layer 68).

Figure 8:
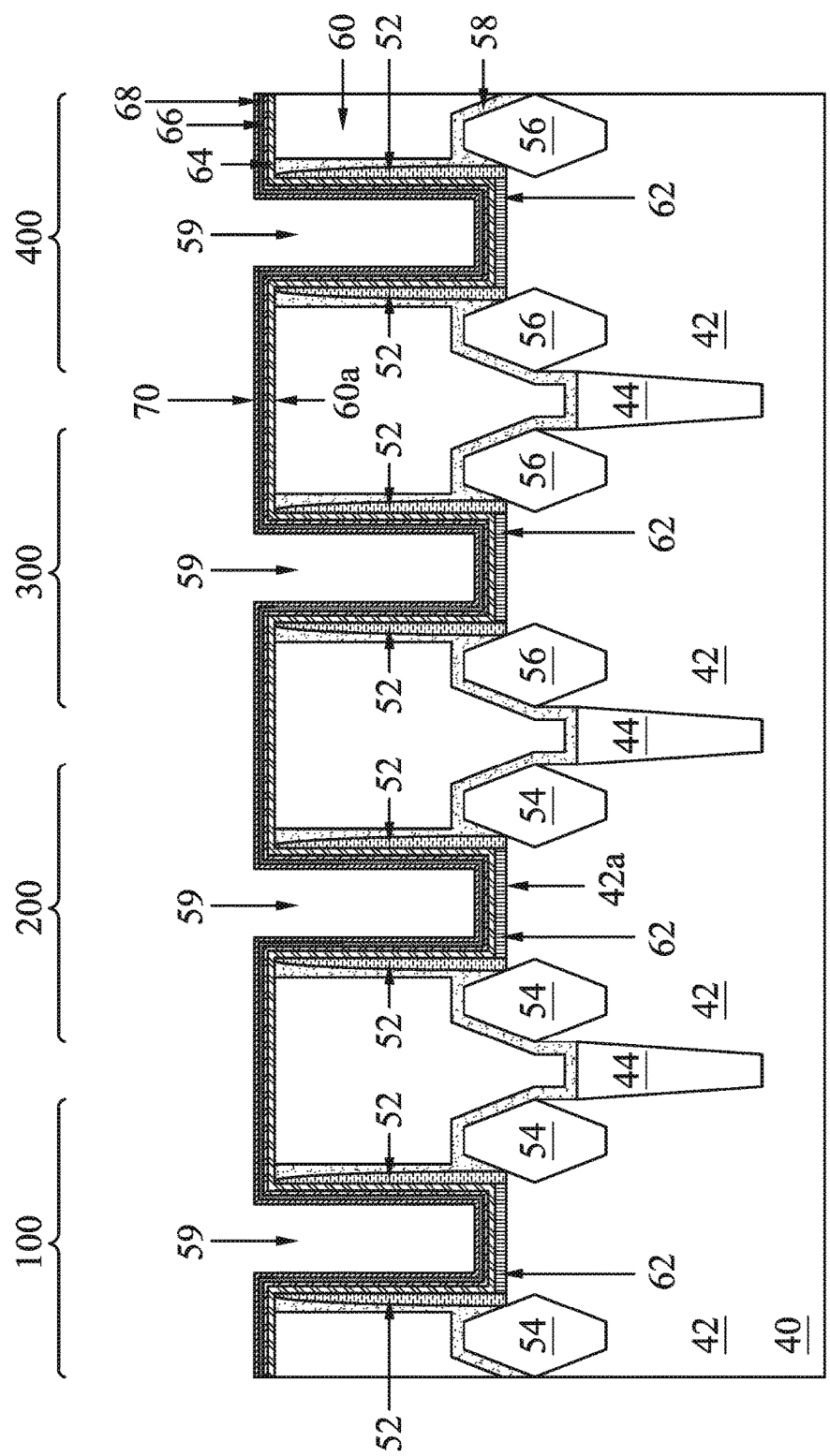

Referring to FIG. 8, a first work function tuning layer 70 is formed on the capping layer (e.g. on the second sub-layer 68). The first work function tuning layer 70 may line the openings 59 (e.g. sidewalls and bottom surface of the openings 59) and may also be formed over portions of the second sub-layer 68 disposed outside the openings 59. The first work function tuning layer 70 may be any acceptable material to tune a work function of a device to a desired amount given the application of the device to be formed, and may be deposited using any acceptable deposition process. In some embodiments, the first work function tuning layer 70 includes titanium (Ti), titanium aluminum (TiAl), tantalum carbide (TaC), titanium aluminum notride (TiAlN), tantalum carbo-nitride (TaCN), tantalum silicon nitride (TaSiN), or the like deposited by ALD, CVD, or the like. A thickness of the first work function tuning layer 70 may be in a range from about 10 Å to about 100 Å, such as about 30 Å.

Figure 9:
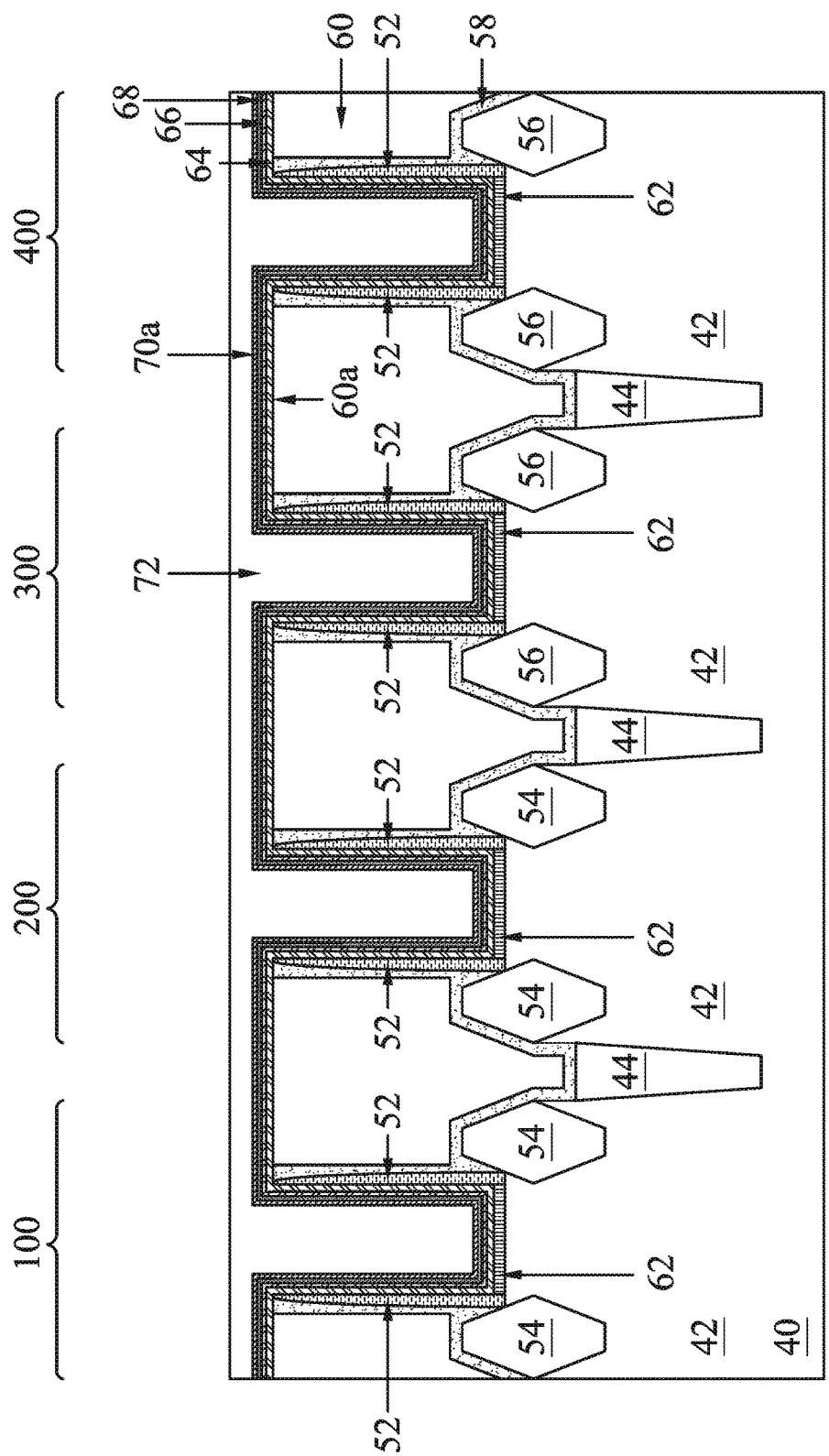

Referring to FIG. 9, a first mask 72 is formed over the first work function tuning layer 70. In some embodiments, such as in the example shown in FIG. 9, the first mask 72 fills the openings 59 lined with the first work function tuning layer 70. The first mask 72 is also formed over portions of the first work function tuning layer 70 disposed outside the openings 59. As an example, the first mask 72 is formed over a surface 70a of first work function tuning layer 70 directed away from the substrate 40. The surface 70a of the first work function tuning layer 70 may be a major surface of the first work function tuning layer 70 farthest from and directed away from the substrate 40. In some embodiments, the first mask 72 may be a bottom anti-reflection coating (BARC). In such embodiments, the BARC may include silicon oxide, silicon oxynitride, or the like, and may be deposited by ALD, CVD, or the like. In other embodiments, the first mask 72 is a photoresist, which may be formed by using a spin-on technique.

Figure 10:
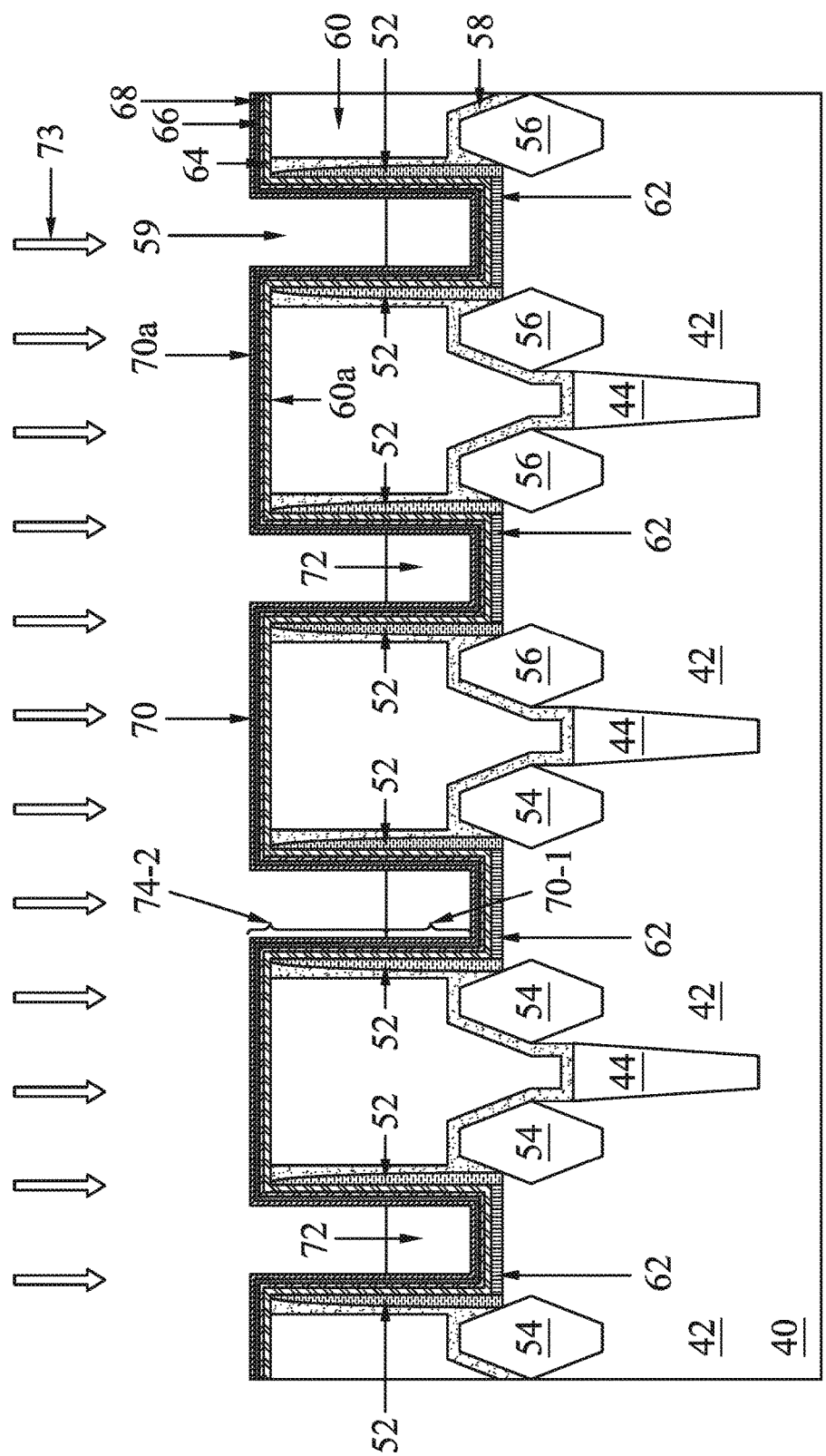

Referring to FIG. 10, the first mask 72 may be recessed into the openings 59 lined with the first work function tuning layer 70. This may be accomplished using a process 73 that is selective to the first mask 72. In other words, the process 73 consumes or removes material of the first mask 72, while leaving material of the first work function tuning layer 70 unconsumed or substantially unperturbed. As a result of recessing the first mask 72, the openings 59 are lined with the first work function tuning layer 70 and partially filled with the first mask 72. The first work function tuning layer 70 lining the openings 59 may have a first portion 70-1 proximal the fins 42, and a second portion 70-1 distal the fins 42 such that the first portion 70-1 is located between the fins 42 and the second portion 70-1. As shown in FIG. 10, the first portion 70-1 remains covered by the first mask 72, while the second portion 70-1 is exposed and is free from the first mask 72. In the embodiment where the first mask 72 is a BARC, the process 73 may be at least one of an isotropic or a wet etch process. In such embodiments, the first mask 72 is etched backed, and the extent to which the first mask 72 is etched may be controlled by process knobs that tune the rate at which the first mask 72 is consumed by etch back process 73. In the embodiment where the first mask 72 is a photoresist, the process 73 may be an ashing processing.

Figure 11:
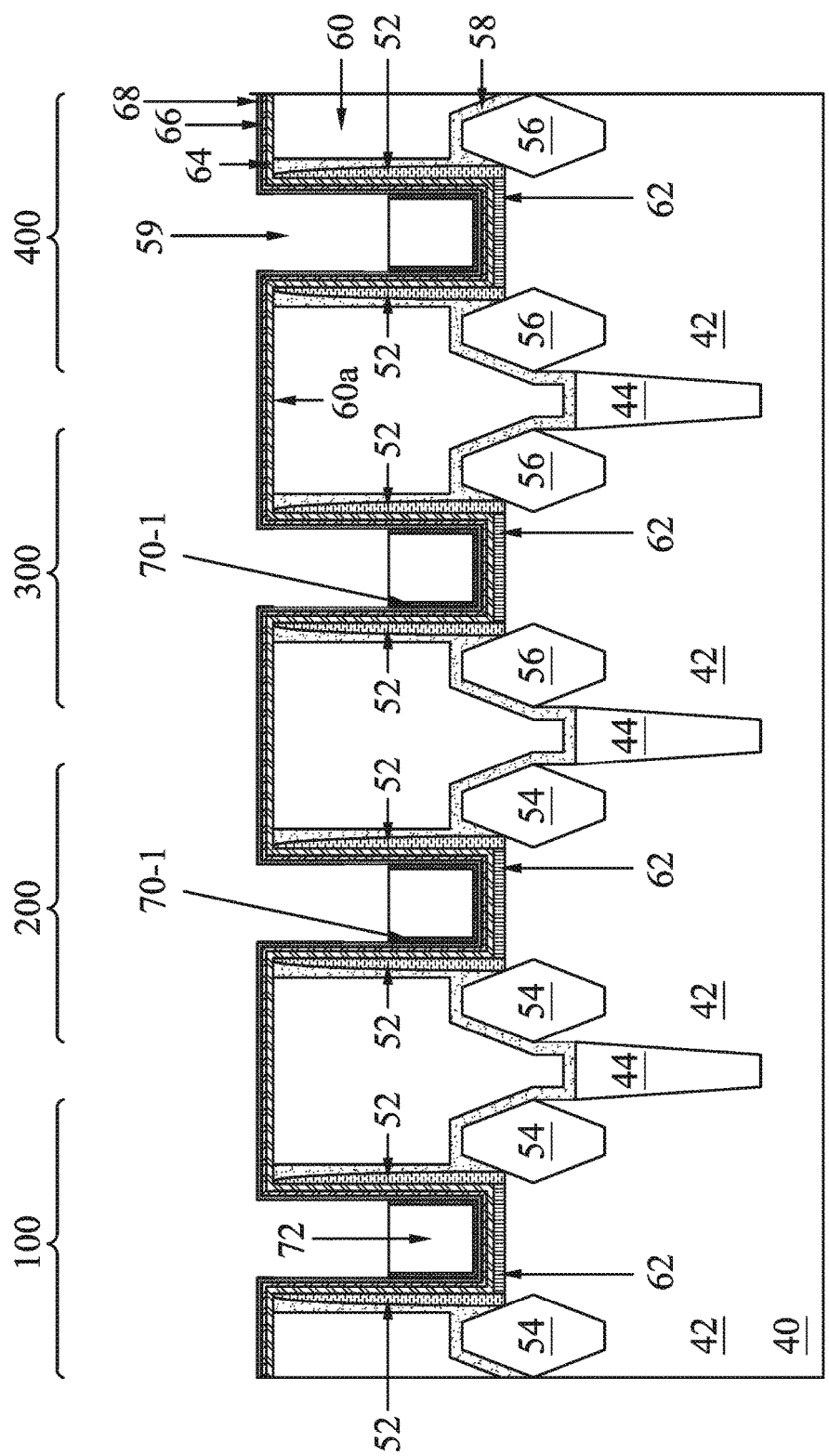
Figure 12:
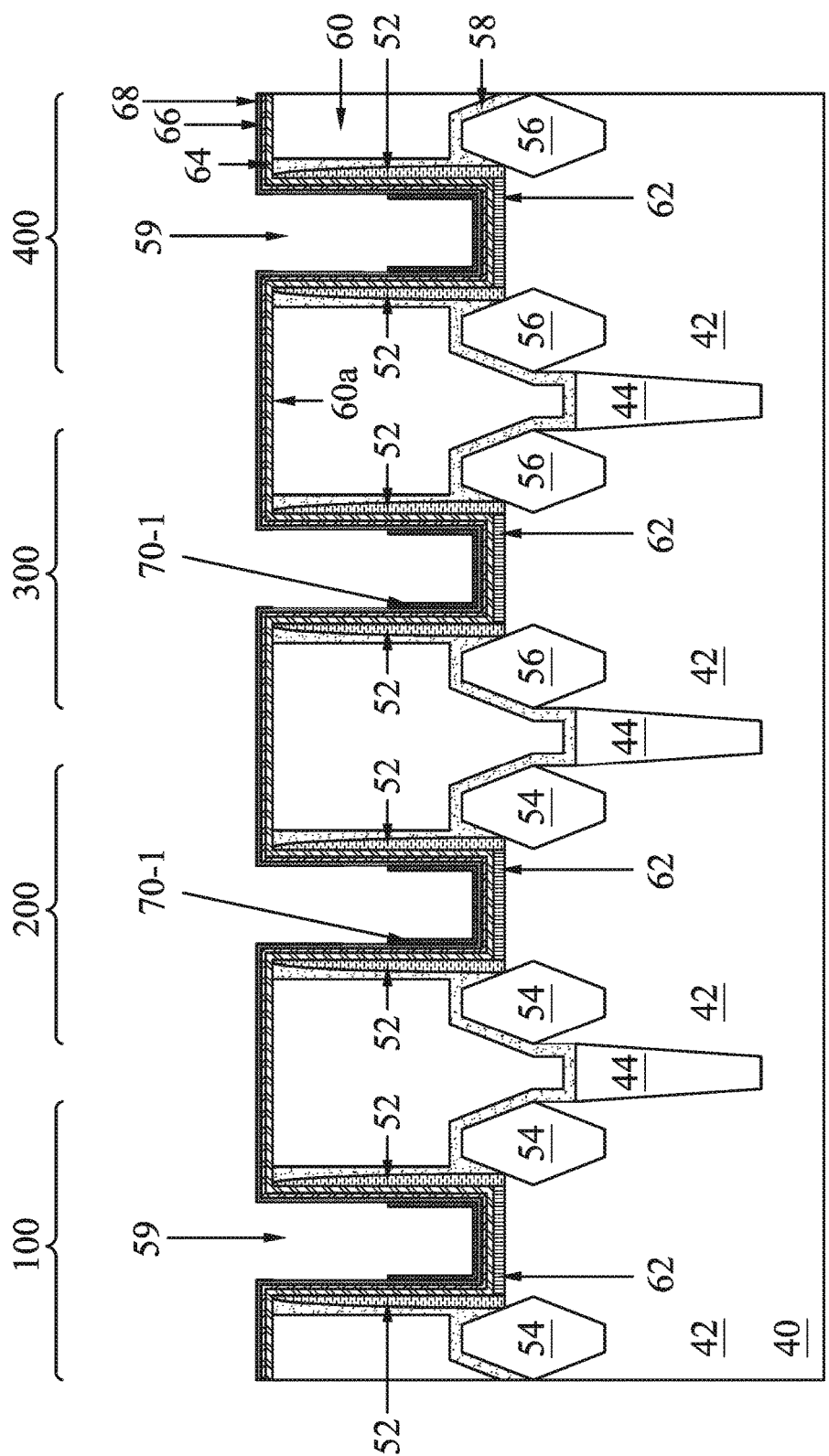

Referring to FIG. 11, an etch selective to the first work function tuning layer 70 is performed to remove exposed portions of the first work function tuning layer 70. In other words, the etch removes or consumes material of first work function tuning layer 70, while leaving material of the capping layer (e.g. second sub-layer 68) substantially unconsumed or unperturbed. As such, the capping layer (e.g. the second sub-layer 68) may act as an etch stop during the etch. As shown in FIG. 11, the second portion 70-2 of the first work function tuning layer 70 that lines the openings 59 is removed, together with portions of the first work function tuning layer 70 disposed outside the openings 59. Consequently, the first portion 70-1 of the first work function tuning layer 70 remains (e.g. since it is covered by the first mask 72 and protected against the etch). Referring to FIG. 12, the first mask 72 is removed using a process similar to the process 73 described above in respect of FIG. 10. As a result, the openings 59 are partially lined with the first work function tuning layer 70. For example, lower portions of the openings 59 (e.g. portions of the openings 59 proximal the fins 42) are lined with the first work function tuning layer 70, while upper portions of the openings 59 (e.g. portions of the openings 59 distal the fins 42) are free from the first work function tuning layer 70. The upper portions of the openings 59, therefore, have sidewalls defined by the capping layer (e.g. second sub-layer 68).

Figure 13:
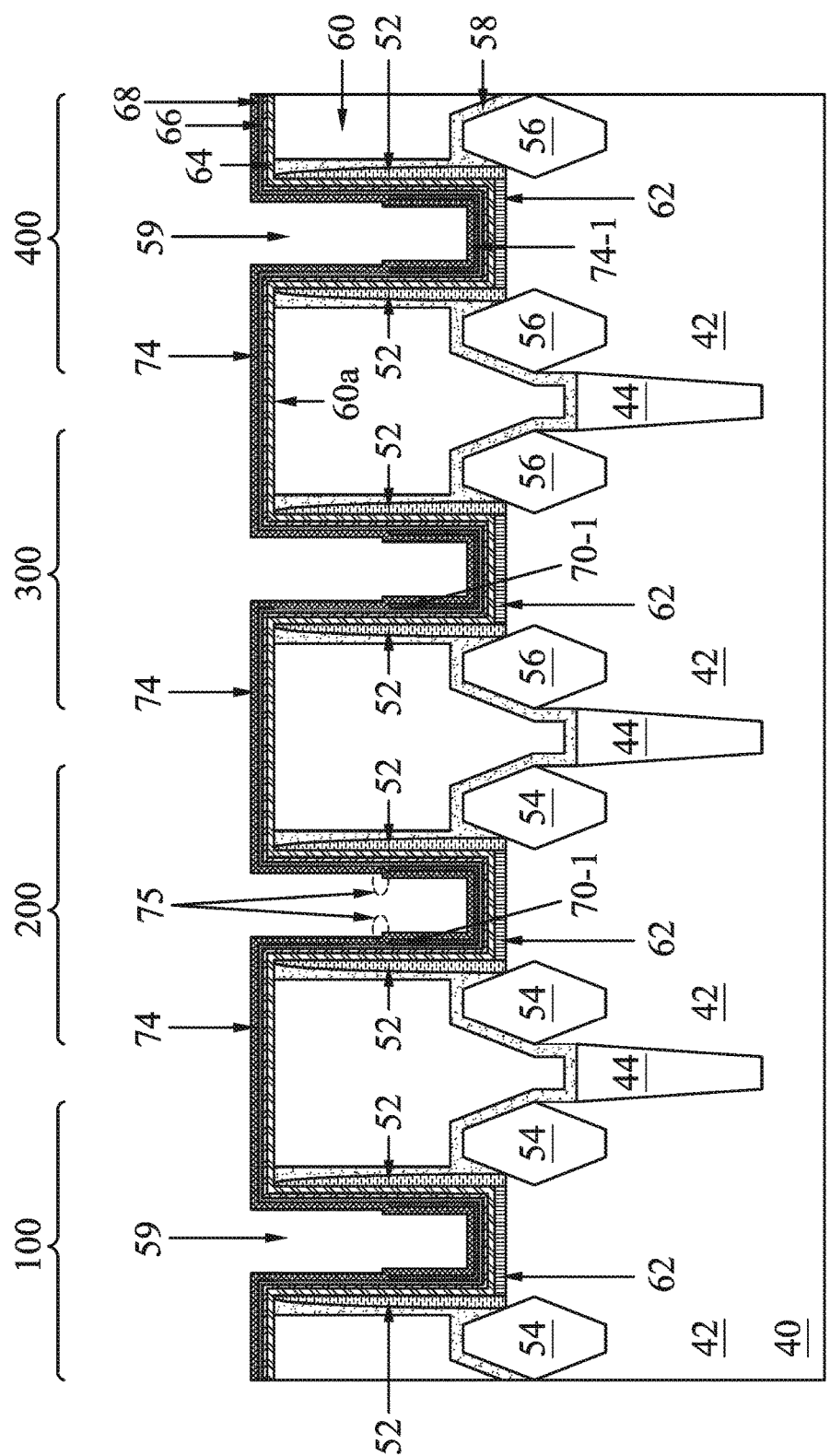

Referring to FIG. 13, a second work function tuning layer 74 is then formed on exposed portions of the capping layer (e.g. on the second sub-layer 68), and on the first work function tuning layer 70 remaining in the openings 59. The second work function tuning layer 74 may be any acceptable material to tune a work function of a device to a desired amount given the application of the device to be formed, and may be deposited using any acceptable deposition process. In some embodiments, the second work function tuning layer 74 includes titanium nitride (TiN) or the like deposited by ALD, CVD, or the like. A thickness of the second work function tuning layer 74 may be in a range from about 10 Å to about 50 Å, such as about 20 Å.

As a result of the second work function tuning layer 74 being formed on the first work function tuning layer 70 and over exposed portions of the capping layer, the second work function tuning layer 74 may have portions that line and overhang the first work function tuning layer 70. The overhangs 75 are disposed within the openings 59. The second work function tuning layer 74 may also line the sidewalls of the openings 59 defined by the capping layer (e.g. the second sub-layer 68). Consequently, the portions of the second work function tuning layer 74 disposed within the openings 59 may have a stair-step shape, as shown in FIG. 13.

Figure 14:
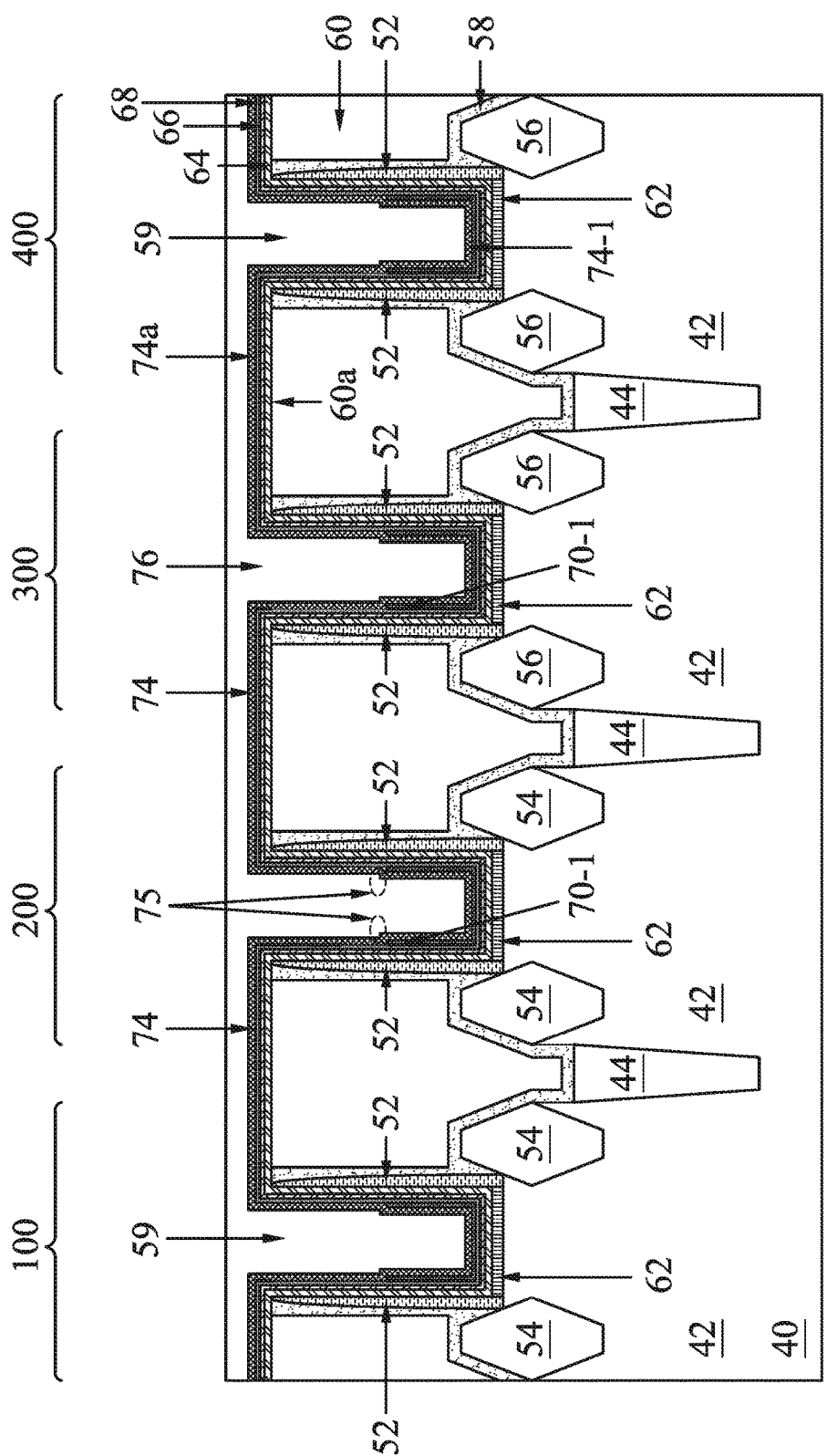

Referring to FIG. 14, a second mask 76 is formed over the second work function tuning layer 74. In some embodiments, such as in the example shown in FIG. 14, the second mask 76 fills the openings 59 and is also formed over portions of the second work function tuning layer 74 disposed outside the openings 59. As an example, the second mask 74 is formed over a surface 74a of the second work function tuning layer 74 directed away from the substrate 40. In some embodiments, the second mask 76 may include similar materials and may be formed using similar methods as described above in respect of first mask 72.

Figure 15:
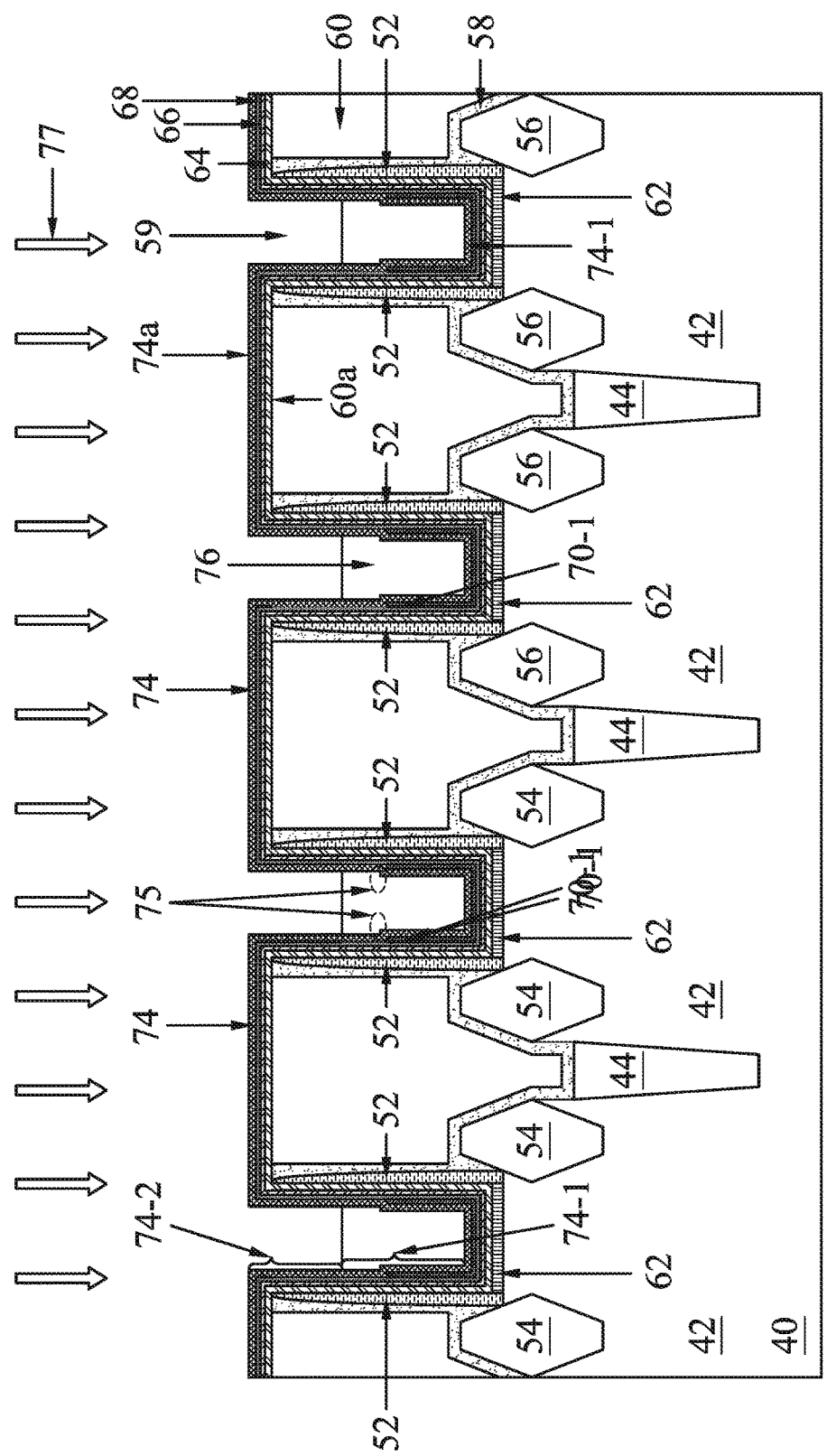

Referring to FIG. 15, the second mask 76 may be recessed into the openings 59 lined with the second work function tuning layer 74. This may be accomplished using a process 77 that is selective to the second mask 76. In other words, the process 77 consumes or removes material of the second mask 76, while leaving material of the second work function tuning layer 74 unconsumed or substantially unperturbed. As a result of recessing the second mask 76, the openings 59 are partially filled with the second mask 76. The second mask 76 also covers the overhangs 75 of the second work function tuning layer 74. The second work function tuning layer 74 lining the openings 59 may have a first portion 74-1 proximal the fins 42, and a second portion 74-1 distal the fins 42 such that the first portion 74-1 is located between the fins 42 and the second portion 74-1. The first portion 74-1 of the second work function tuning layer 74 includes portions of the second work function tuning layer 74 lining and overhanging the first work function tuning layer 70-1, and lining a lower portion of the sidewalls of openings 59 defined by the capping layer (e.g. the second sub-layer 68). As shown in FIG. 15, the first portion 74-1 remains covered by the second mask 76, while the second portion 74-1 is exposed and is free from the second mask 76. In the embodiment where the second mask 76 is a BARC, the process 77 may be at least one of an isotropic or a wet etch process. In such embodiments, the second mask 76 is etched backed, and the extent to which the second mask 76 is etched may be controlled by process knobs that tune the rate at which the second mask 76 is consumed by etch back process 77. In the embodiment where the second mask 76 is a photoresist, the process 77 may be an ashing processing.

Figure 16:
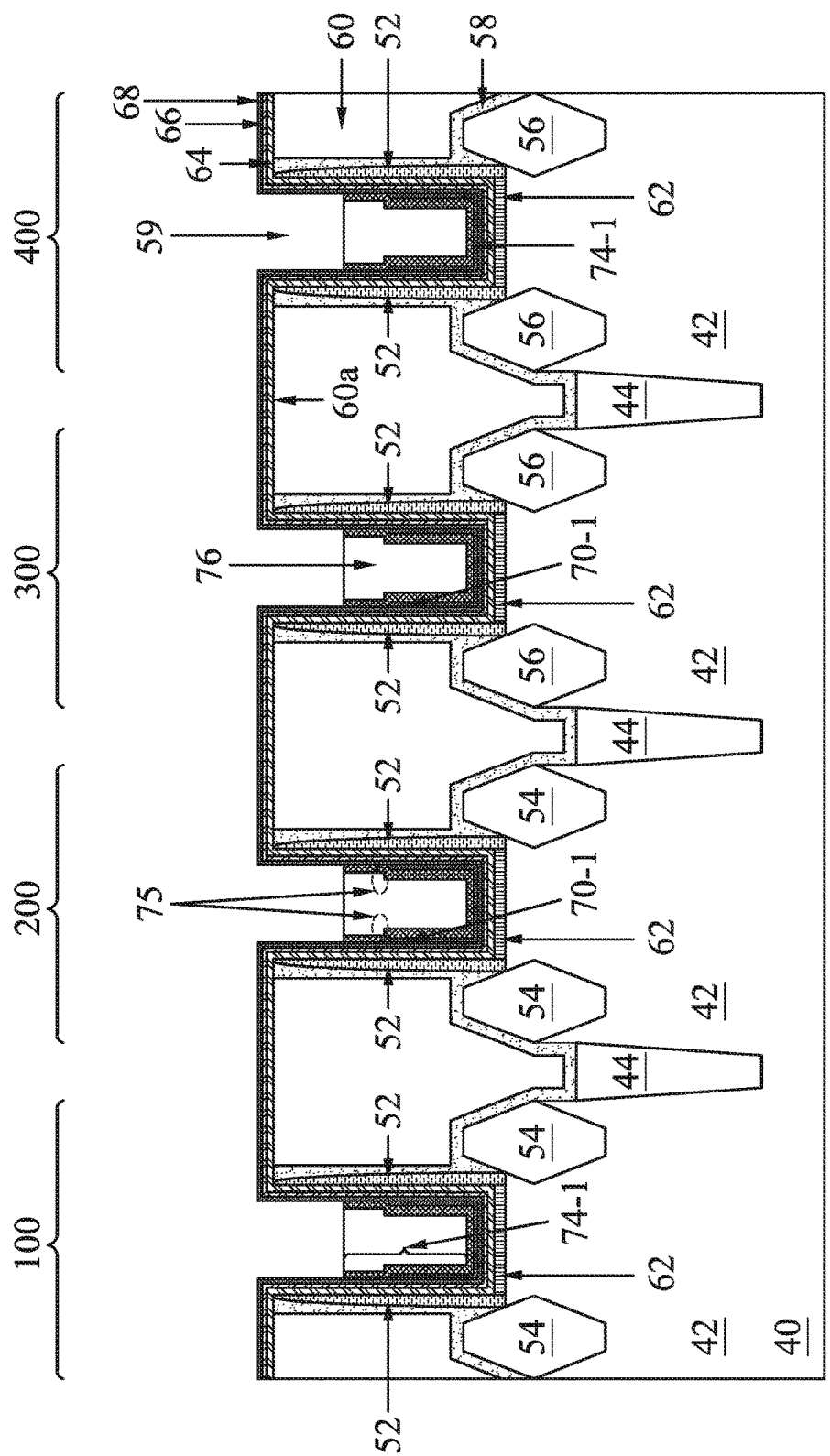
Figure 17:
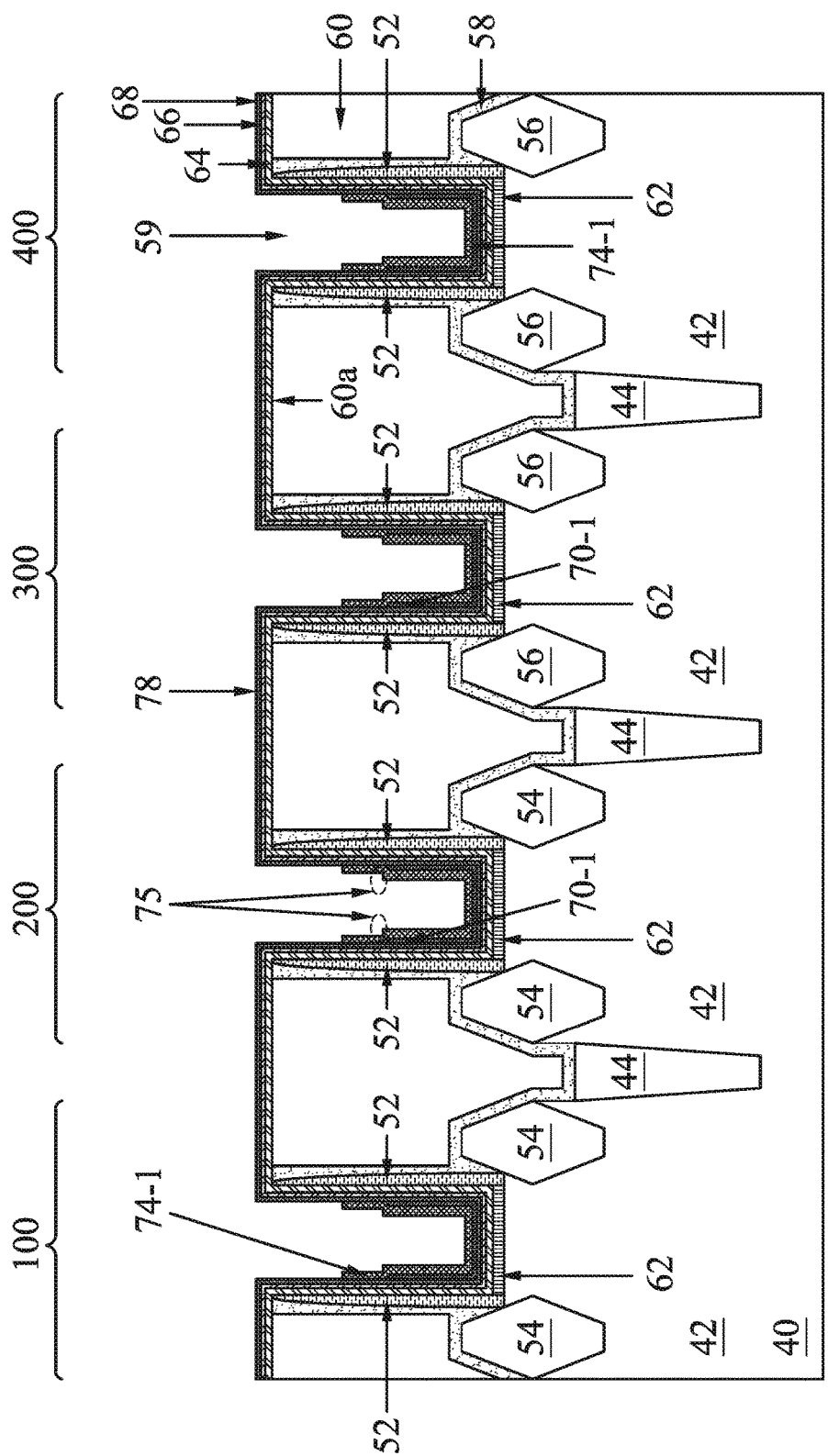

Referring to FIG. 16, an etch selective to the second work function tuning layer 74 is performed to remove exposed portions of the second work function tuning layer 74. In other words, the etch removes or consumes material of the second work function tuning layer 74, while leaving material of the capping layer (e.g. second sub-layer 68) substantially unconsumed or unperturbed. As such, the capping layer (e.g. the second sub-layer 68) may act as an etch stop during the etch. As shown in FIG. 16, the second portion 74-2 of the second work function tuning layer 74 that lines the openings 59 is removed, together with portions of the first work function tuning layer 70 disposed outside the openings 59. Consequently, the first portion 74-1 of the second work function tuning layer 74 remains (e.g. since it is covered by the second mask 76 and protected against the etch). Referring to FIG. 17, the second mask 76 is removed using a process similar to the process 73 described above in respect of FIG. 10.

Figure 18:
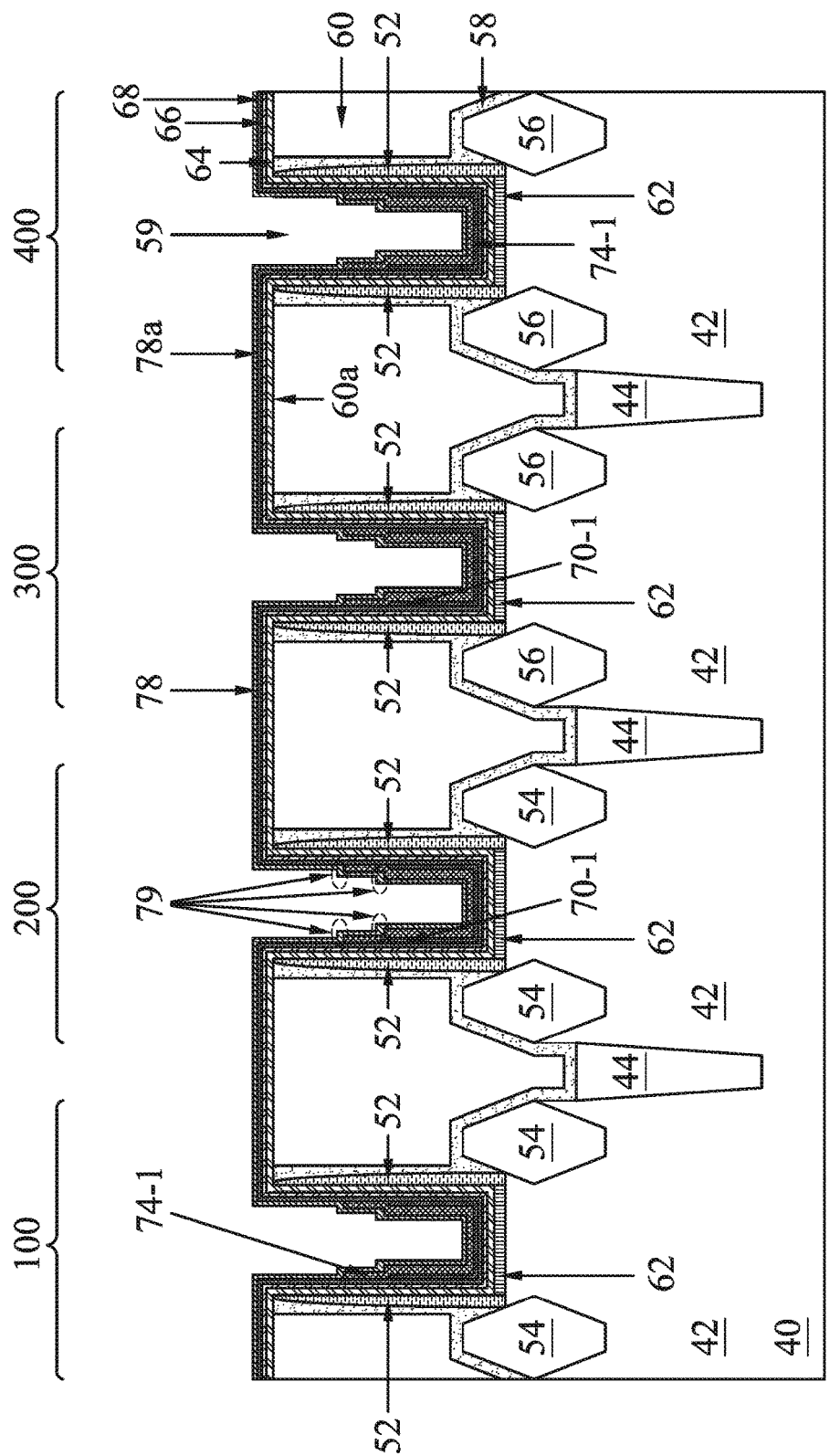

Referring to FIG. 18, a third work function tuning layer 78 is then formed on exposed portions of the capping layer (e.g. on the second sub-layer 68), and on the second work function tuning layer 74 remaining in the openings 59. The third work function tuning layer 78 may be any acceptable material to tune a work function of a device to a desired amount given the application of the device to be formed, and may be deposited using any acceptable deposition process. In some embodiments, the third work function tuning layer 78 includes titanium nitride (TiN) or the like deposited by ALD, CVD, or the like. A thickness of the third work function tuning layer 78 may be in a range from about 10 Å to about 50 Å, such as about 20 Å.

As a result of the third work function tuning layer 78 being formed on the second work function tuning layer 74 and over exposed portions of the capping layer, the third work function tuning layer 78 may have portions that line and overhang the second work function tuning layer 74. The overhangs 79 are disposed within the openings 59. The third work function tuning layer 78 may also line the sidewalls of the openings 59 defined by the capping layer (e.g. the second sub-layer 68). Consequently, the portions of the third work function tuning layer 78 disposed within the openings 59 may have a stair-step shape, as shown in FIG. 18.

Figure 19:
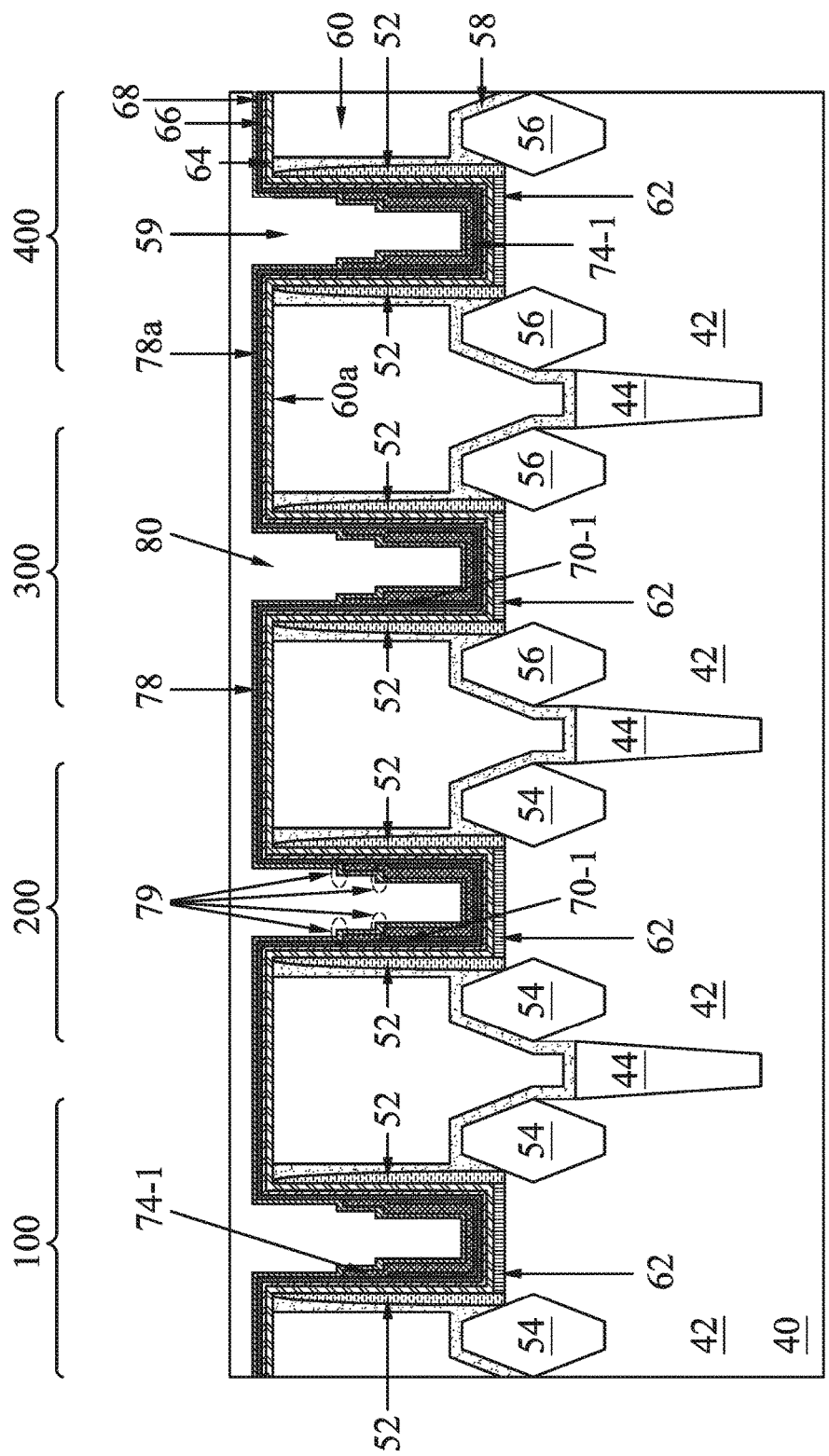

Referring to FIG. 19, a third mask 80 is formed over the third work function tuning layer 78. In some embodiments, such as in the example shown in FIG. 19, the third mask 80 fills the openings 59 and is also formed over portions of the third work function tuning layer 78 disposed outside the openings 59. As an example, the third mask 80 is formed over a surface 78a of the third work function tuning layer 78 directed away from the substrate 40. In some embodiments, the third mask 80 may include similar materials and may be formed using similar methods as described above in respect of first mask 72.

Figure 20:
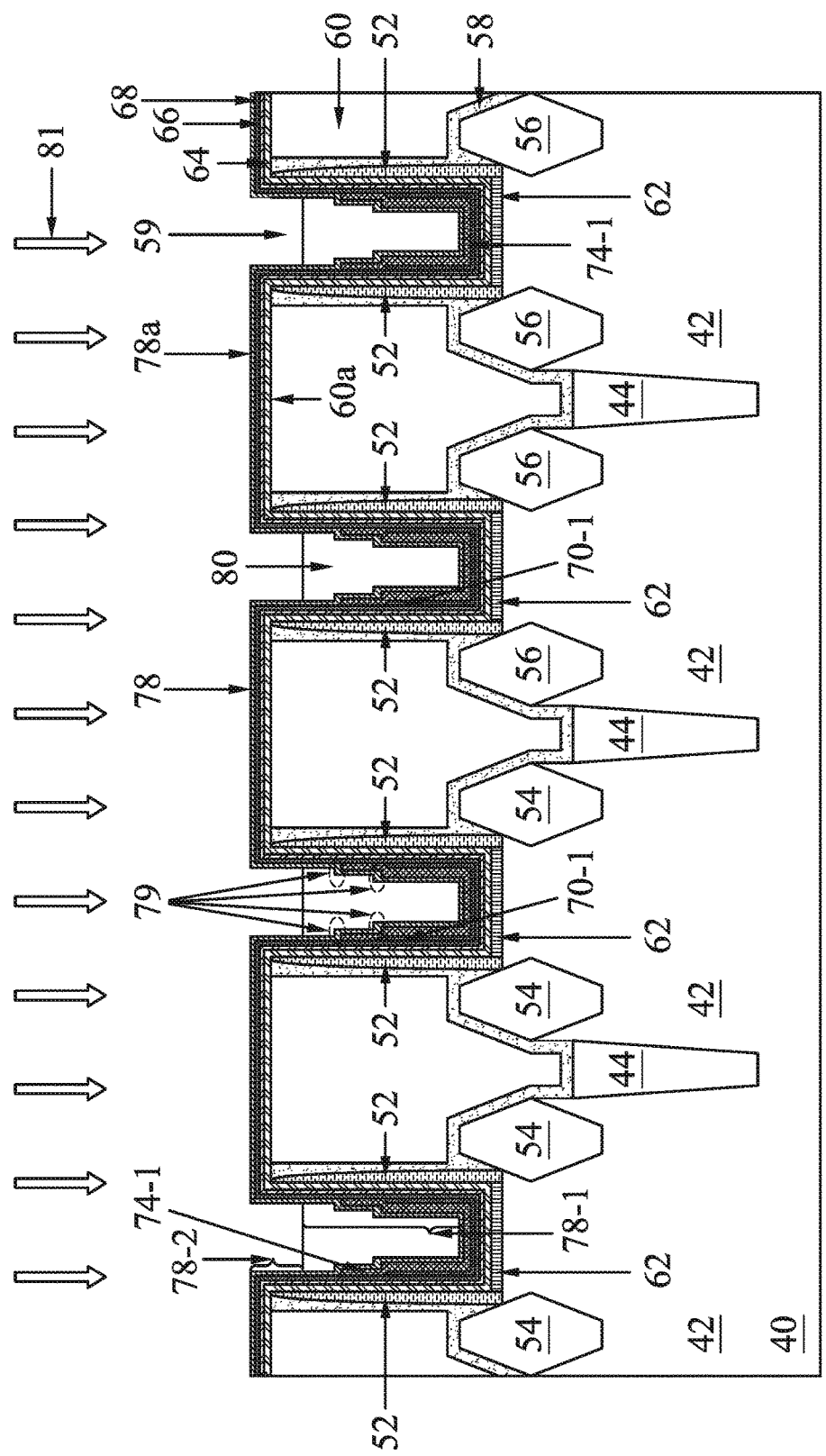

Referring to FIG. 20, the third mask 80 may be recessed into the openings 59 lined with the third work function tuning layer 78. This may be accomplished using a process 81 that is selective to the third mask 80. In other words, the process 81 consumes or removes material of the third mask 80, while leaving material of the third work function tuning layer 78 unconsumed or substantially unperturbed. As a result of recessing the third mask 80, the openings 59 are partially filled with the third mask 80. The third mask 80 also covers the overhangs 79 of the third work function tuning layer 78. The third work function tuning layer 78 lining the openings 59 may have a first portion 78-1 proximal the fins 42, and a second portion 78-1 distal the fins 42 such that the first portion 78-1 is located between the fins 42 and the second portion 78-1. The first portion 78-1 of the third work function tuning layer 78 includes portions of the third work function tuning layer 78 lining and overhanging the second work function tuning layer 74-1, and lining a lower portion of the sidewalls of openings 59 defined by the capping layer (e.g. the second sub-layer 68). As shown in FIG. 20, the first portion 78-1 remains covered by the third mask 80, while the second portion 78-1 is exposed and is free from the third mask 80. In the embodiment where the third mask 80 is a BARC, the process 81 may be at least one of an isotropic or a wet etch process. In such embodiments, the third mask 80 is etched backed, and the extent to which the third mask 80 is etched may be controlled by process knobs that tune the rate at which the third mask 80 is consumed by etch back process 81. In the embodiment where the third mask 80 is a photoresist, the process 81 may be an ashing processing.

Figure 21:
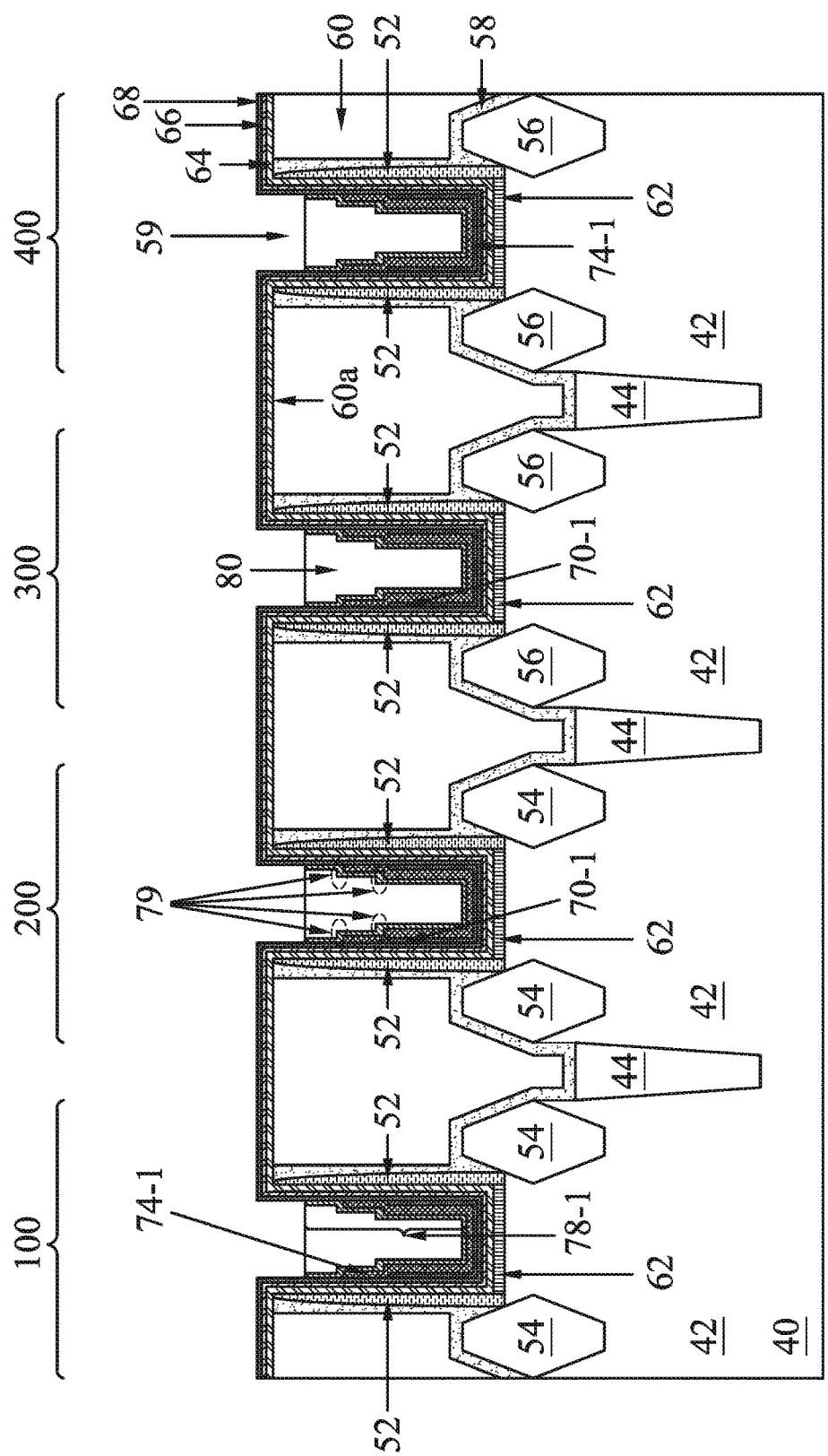

Referring to FIG. 21, an etch selective to the third work function tuning layer 78 is performed to remove exposed portions of the third work function tuning layer 78. In other words, the etch removes or consumes material of the third work function tuning layer 78, while leaving material of the capping layer (e.g. second sub-layer 68) substantially unconsumed or unperturbed. As such, the capping layer (e.g. the second sub-layer 68) may act as an etch stop during the etch. As shown in FIG. 21, the second portion 78-2 of the third work function tuning layer 78 that lines the openings 59 is removed, together with portions of the third work function tuning layer 78 disposed outside the openings 59. Consequently, the first portion 78-1 of the second third function tuning layer 78 remains (e.g. since it is covered by the third mask 80 and protected against the etch).

Figure 22:
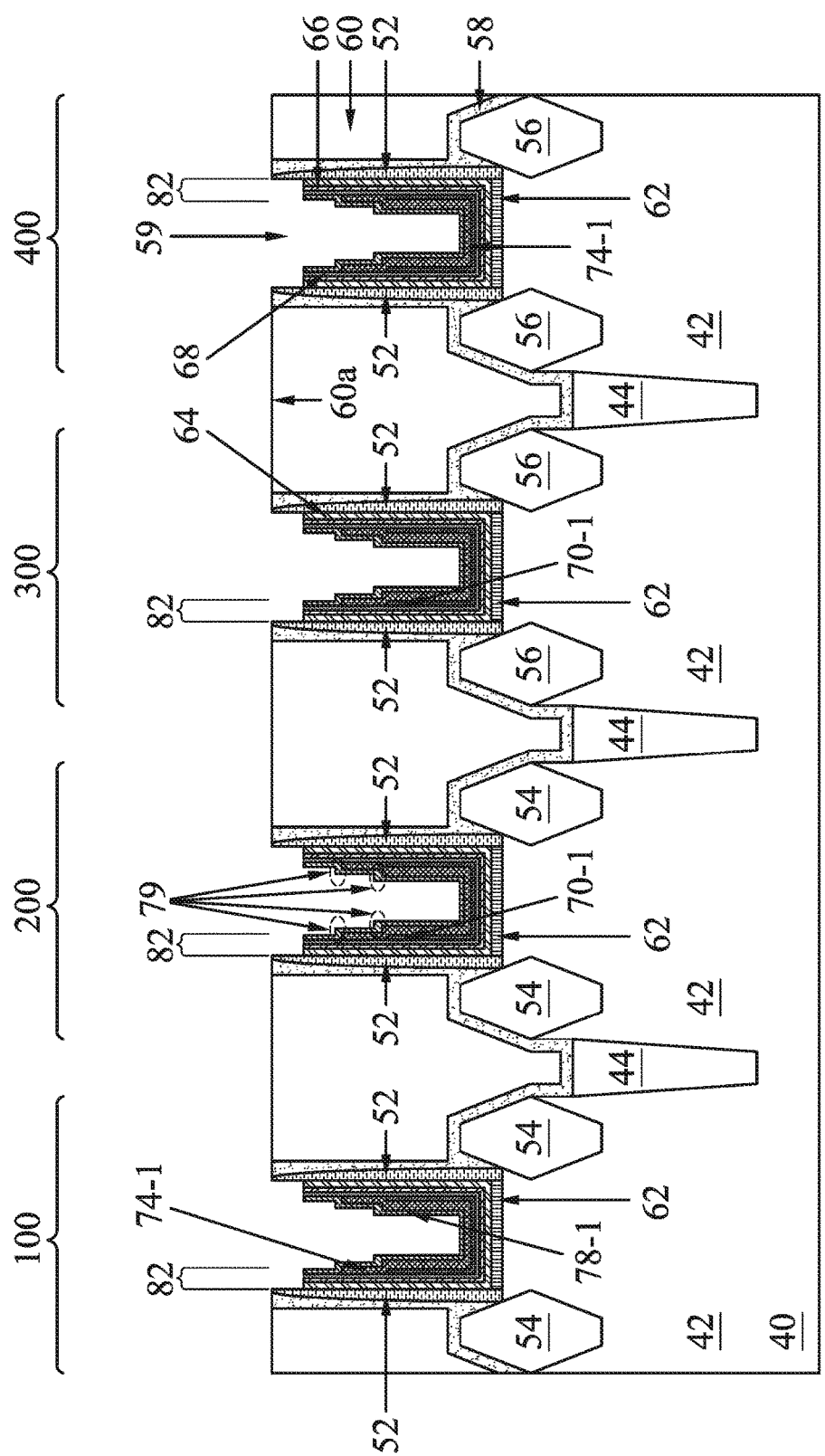

Referring to FIG. 22, exposed portions of the gate dielectric layer 64 and capping layer (including sub-layers 66 and 68) are etched (e.g. using third mask 80 as a mask). As a result, layered structures 82 are formed in the first, second, third, and fourth regions 100, 200, 300, and 400. The etch may be, for example, a dry or wet etch that may be selective to the materials of the gate dielectric layer 64 and capping layer, with work function tuning layers 70-1, 74-1, and 78-1 being left unconsumed or substantially unperturbed by the etch. Process parameters may be tuned to achieve the structure in FIG. 22. Following removal of exposed portions of the gate dielectric layer 64 and capping layer, the third mask 80 is removed using a process similar to the process 73 described above in respect of FIG. 10.

Figure 23:
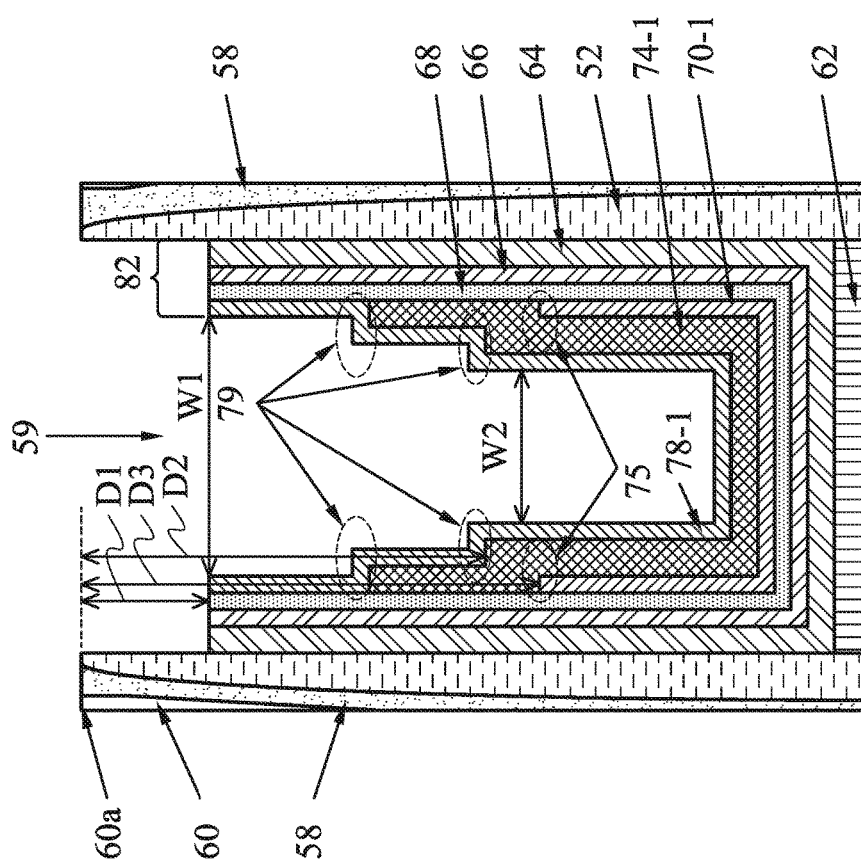
FIGS. 23 and 30 are enlarged views of a work function tuning structure formed, in accordance with some embodiments.

FIG. 23 shows an enlarged view of the layered structure 82 formed in the fourth region 400, which is shown to clarify the layers formed therein. As shown in FIG. 23, the layered structure 82 is recessed with respect to the top surface 60a of ILD0 60 by a first depth D1 (which can be less than or equal to about 50 nm). In some embodiments, such as in the example of FIG. 23, a surface of the third work function tuning layer 78-1 farthest from and directed away from the substrate 40 may be recessed with respect to the top surface 60a of ILD0 60 by the first depth D1. Also shown in FIG. 23 is a second depth D2, which may be a measure of how much a surface of the second work function tuning layer 74-1 farthest from and directed away from the substrate 40 may be recessed with respect to the top surface 60a of ILD0 60. In some embodiments, the first depth D1 may be between about 5 percent to about 50 percent less than the second depth D2. FIG. 23 further shows a third depth D3, which may be a measure of how much a surface of the first work function tuning layer 70-1 farthest from and directed away from the substrate 40 may be recessed with respect to the top surface 60a of ILD0 60. In some embodiments, the second depth D2 may be between about 5 percent to about 50 percent less than the third depth D3.

As can be seen from the process flow described above in respect of FIGS. 5 to 22, following the formation of each work function tuning layer 70, 74, and 78, an etch back process recesses the work function tuning layer 70, 74, and 78 into the openings 59. The etch back process is controlled such that overhangs 75 and 79 are maintained within the openings 59. This may result in the layered structure 82 that includes work function tuning layers 70-1, 74-1, and 78-1 that have a stair-step shape, within process variations. In other words, the layered structure 82 may have sidewalls with stair-step-like increments. The shape of the sidewalls of the layered structure 82 shown in FIG. 23 may be contrasted with one obtained by other methods of forming work function tuning layers for gate structures, where the sidewalls of such layered structures mimic a shape of inner sidewalls of the gate spacers 52 and are devoid of stair-step-like increments (e.g. substantially parallel to inner sidewalls of the gate spacers 52). An effect of having the layered structure 82 with sidewalls having stair-step-like increments is that voids, caused when the openings 59 are filled with conductive material, are avoided or substantially reduced. This may be due to a dimension W1 (located at a top of layered structure 82) being greater than (e.g. about 20 percent to about 50 percent greater than) a dimension W2 (located at a bottom of layered structure 82). As such, the stair-step-like increments allow for a uniform filling of the openings 59 when a conductive material (e.g. that forms a gate structure) is deposited into the openings 59. Furthermore, since voids may be avoided or substantially reduced, damage to fins 42 may be avoided or substantially reduced during an etch back of the conductive material. In some embodiments, dimension W2 may be in a range from about 5 nm to about 20 nm, although other dimensions may be possible as well.

Figure 24:
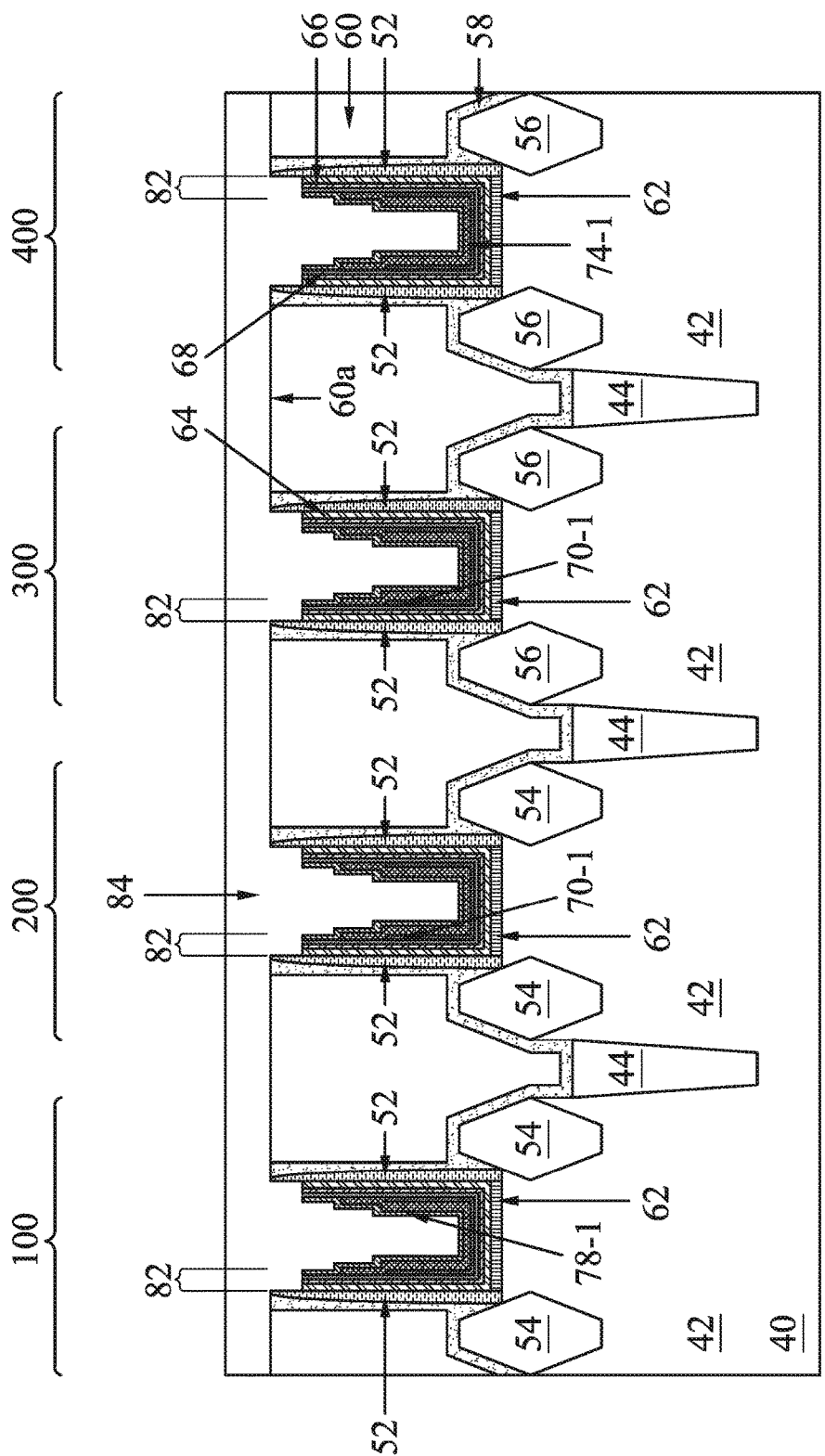
Figure 25:
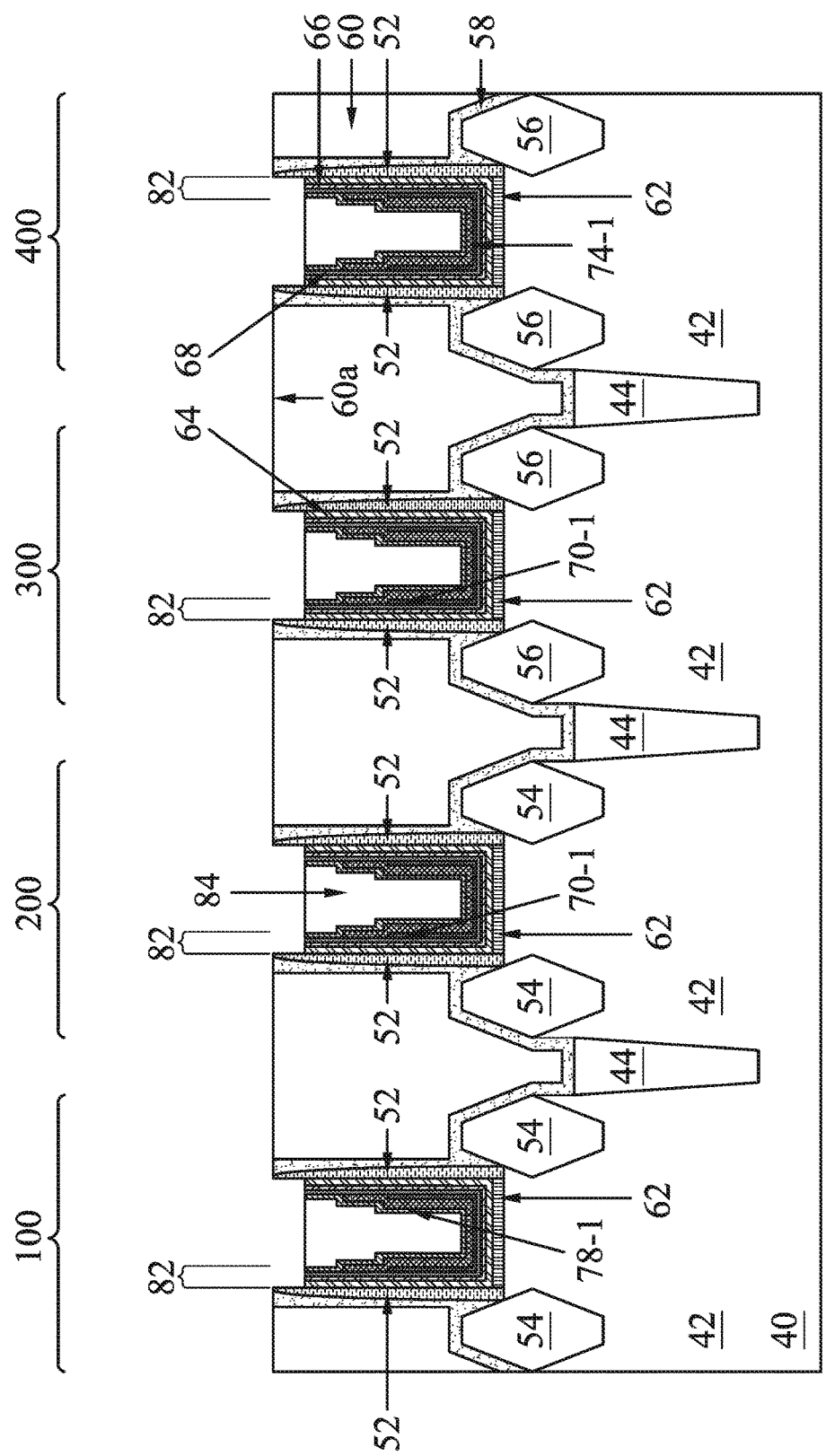

Referring to FIG. 24, a conductive material 84 is deposited in the openings on the layered structures 82 and on the ILD0 60. The conductive material 84 may include a metal, such as tungsten (W), aluminum (Al), cobalt (Co), ruthenium (Ru), combinations thereof or the like. In some other examples, conductive material 84 may include polysilicon. The conductive material 84 may be deposited using CVD, physical vapor deposition (PVD), the like, or a combination thereof. As an example, the CVD process used to deposit conductive material 84 may be a low-pressure chemical vapor deposition (LPCVD) or a plasma enhanced chemical vapor deposition (PECVD). The conductive material 84 at least fills portions of the openings 59 not filled by the layered structures 82. The conductive material 84 and the layered structures 82 may, together, form a gate structure that may be used for the fins 42.

Next, a planarization process, such as a CMP, may be performed to remove the excess portions of conductive material 84, which excess portions are over the top surface of ILD0 60. A controlled etch-back selective to the conductive material 84, and possibly selective to the layered structures 82, may be subsequently performed to recess the conductive material 84 from the top surface of the ILD0 60, which results in the gate structures illustrated in FIG. 25.

Figure 26:
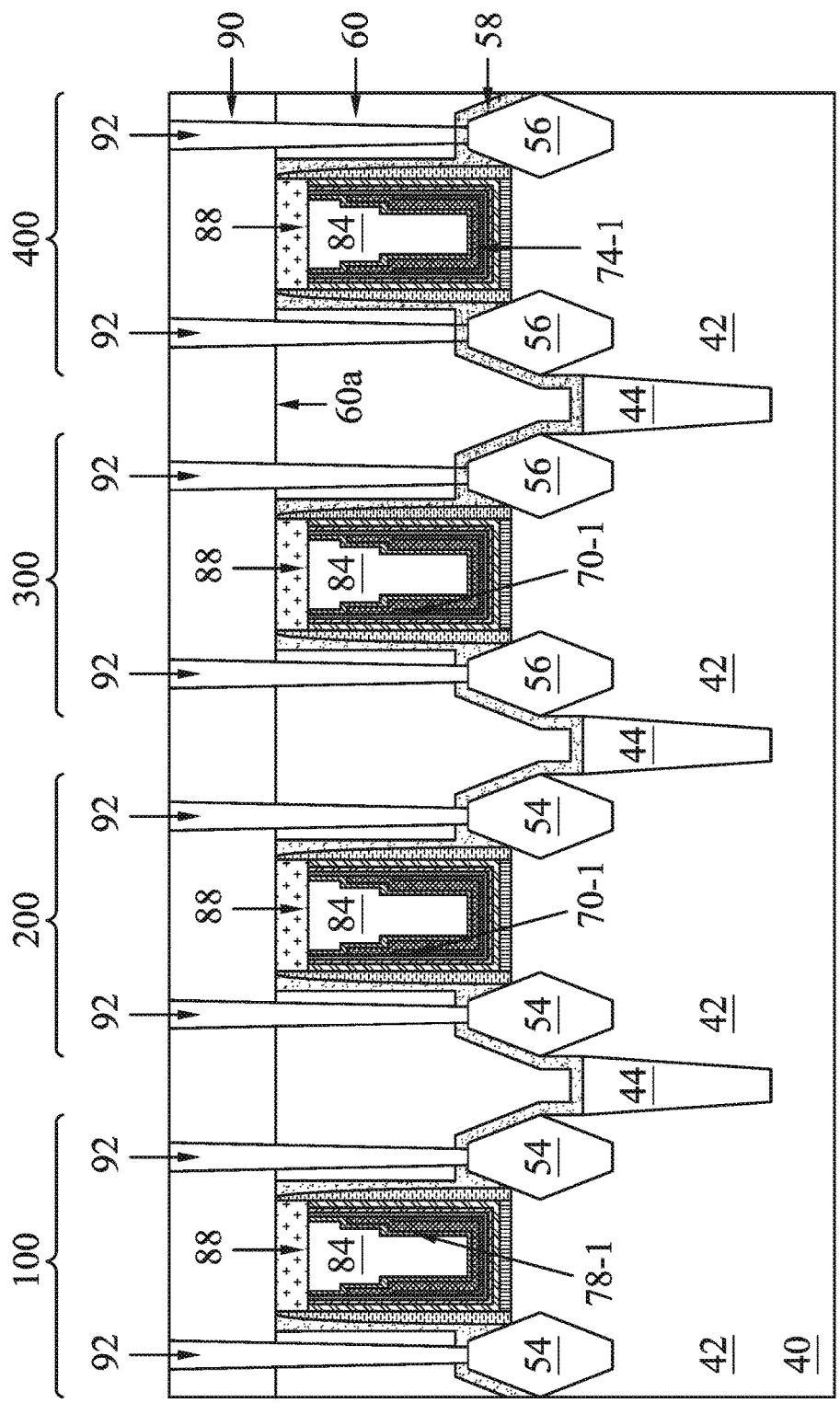

In FIG. 26, dielectric caps 88 are formed on the conductive material 84 and the layered structures 82. To form the dielectric caps 88, a cap dielectric layer may be deposited in the remaining portions of the openings above the conductive material 84 and the layered structures 82, and on the top surface of the ILD0 60. The cap dielectric layer may include silicon nitride, silicon carbonitride, or the like, formed using CVD, PECVD, or the like. The cap dielectric layer may then be planarized, such as by CMP, to form top surfaces co-planar with the top surface of the ILD0 60 thereby forming the dielectric caps.

An upper ILD (ILD1) 90 is deposited over the ILD0 60 and the dielectric caps 88, and contacts 92 are formed through the ILD1 90, ILD0 60, and ESL 58 to the epitaxial source/drain regions 54 and 56. ILD1 90 is formed of a dielectric material such as PSG, BSG, BPSG, USG, or the like, and may be deposited by any suitable method, such as CVD and PECVD. Openings for contacts 92 are formed through the ILD1 90, ILD0 60, and ESL 58. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 90. The remaining liner and conductive material form contacts 92 in the openings. An anneal process may be performed to form a silicide at the interface between the epitaxial source/drain regions 54 and 56 and the contacts 92, respectively.

Although not explicitly shown, a person having ordinary skill in the art readily understands that further processing steps may be performed on the structure in FIG. 15A. For example, various inter-metal dielectrics (IMD) and their corresponding metallization may be formed over ILD1 90.

Figure 27:
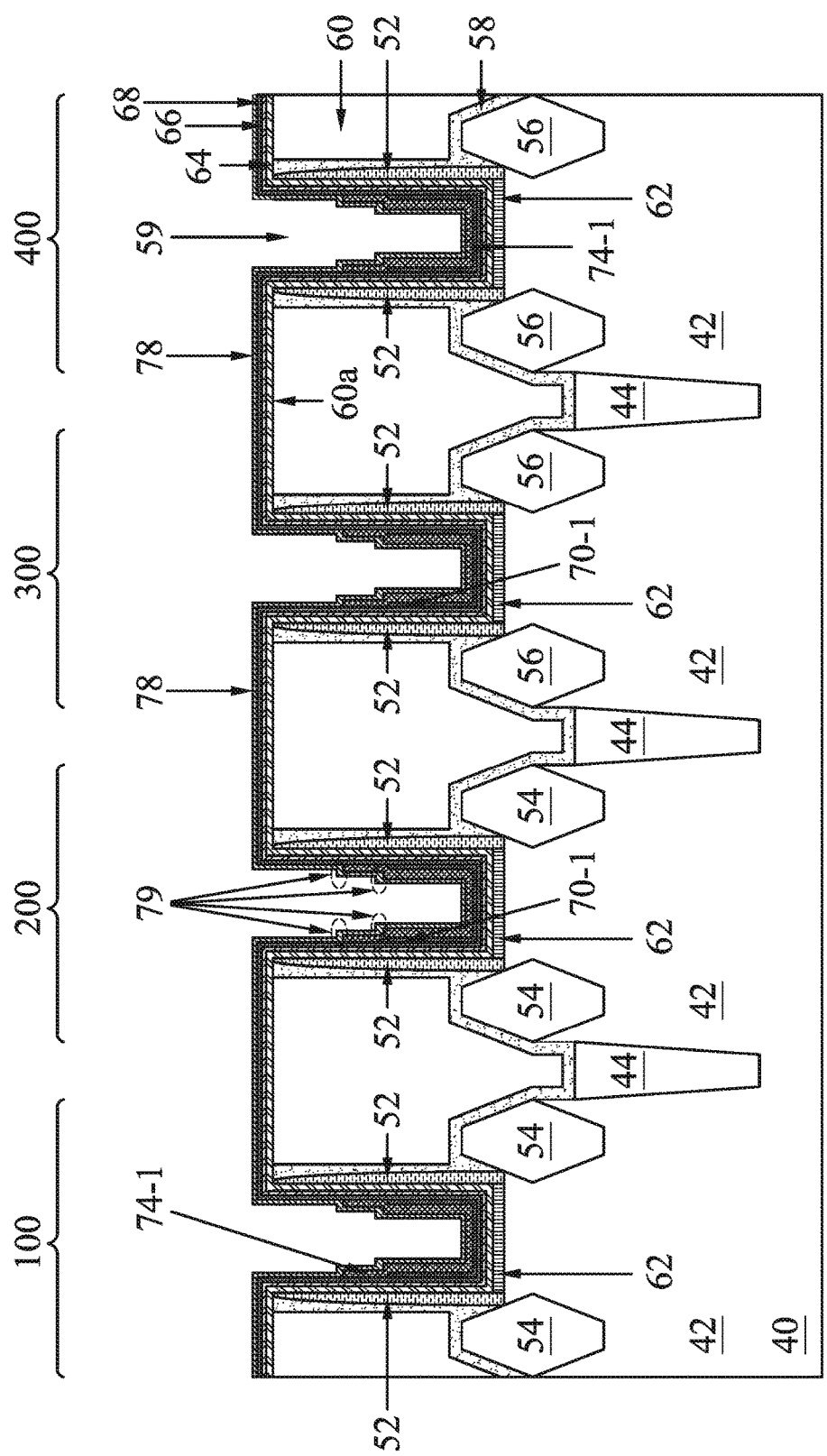
FIGS. 27 through 29 are cross-sectional views of intermediate stages in the manufacturing of finFETs, in accordance with some embodiments.

The process flow depicted in the preceding figures is just one example of intermediate stages in the manufacturing of finFETs. Another example of intermediate stages in the manufacturing of finFETs is shown in FIGS. 27 to 30. FIG. 27 is identical to FIG. 18, and the structure shown in FIG. 27 may be formed using some or all of the steps depicted above in respect of FIGS. 2, 3B, 4B, and 5-18, as an example. As shown in FIG. 27, third work function tuning layer 78 may be formed on exposed portions of the capping layer (e.g. on the second sub-layer 68), and on the second work function tuning layer 74-1 remaining in the openings 59.

Figure 28:
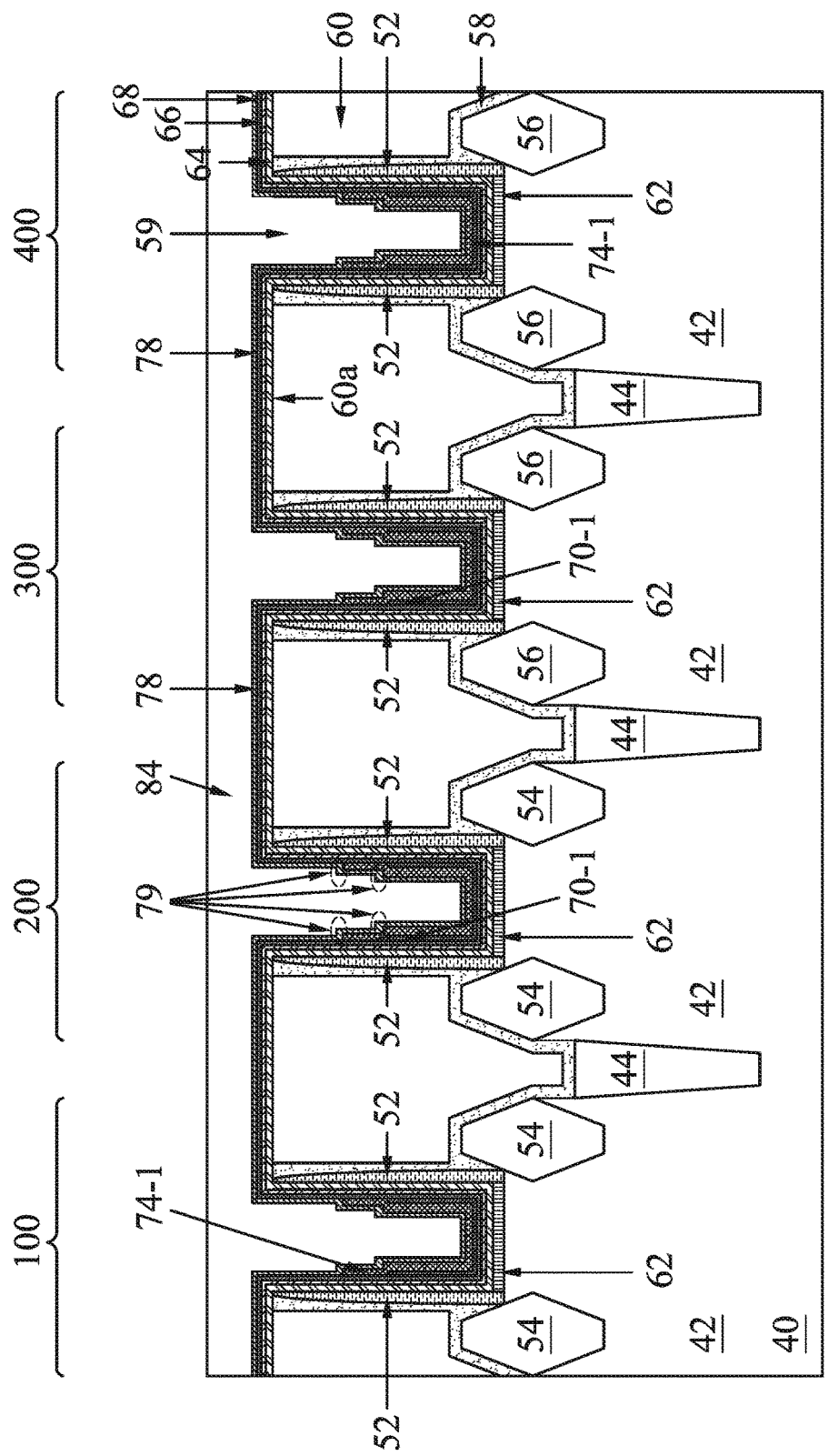

Referring to FIG. 28, conductive material 84 is deposited in the openings 59 (e.g. to fill the openings 59). As shown in the example of FIG. 28, conductive material 84 may also be disposed over ILD0 60 such that work function tuning layer 78, capping layer (e.g. first sub-layer 66 and second sub-layer 68), and gate dielectric layer 64 are positioned between conductive material 84 and ILD0 60. In other words, conductive material 84 may have a portion disposed in the openings 59 and another portion disposed outside the openings 59 and over work function tuning layer 78.

Figure 29:
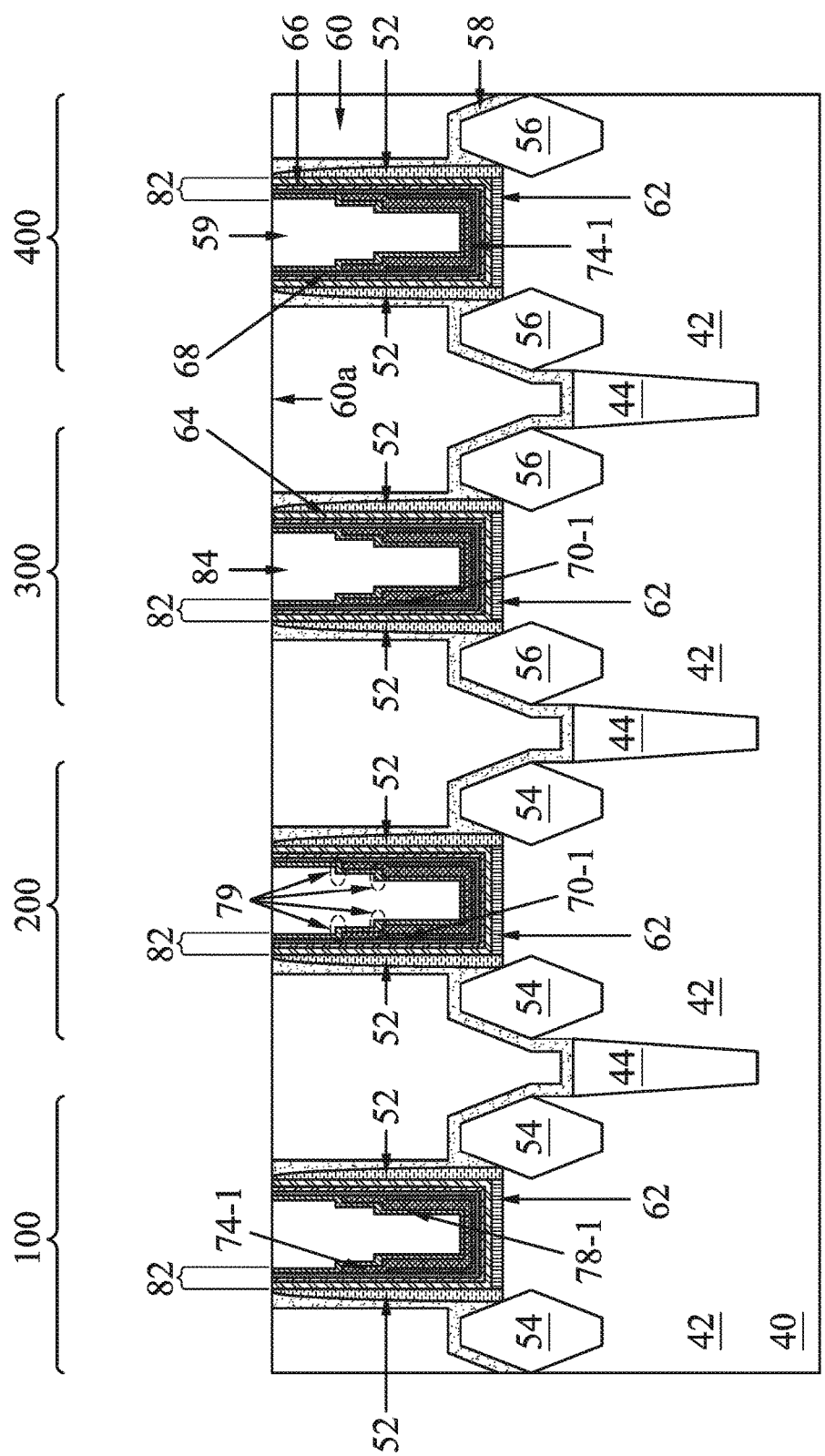

As shown in FIG. 29, a planarization process, such as a CMP, may subsequently be performed to remove portions of conductive material 84 disposed outside the openings 59 and portions of work function tuning layer 78, capping layer (e.g. first sub-layer 66 and second sub-layer 68), and gate dielectric layer 64 disposed over ILD0 60. In so doing, layered structures 82 and conductive material 84 (which may collectively form a gate structure) may have surfaces that are substantially co-planar with ILD0 60.

Figure 30:
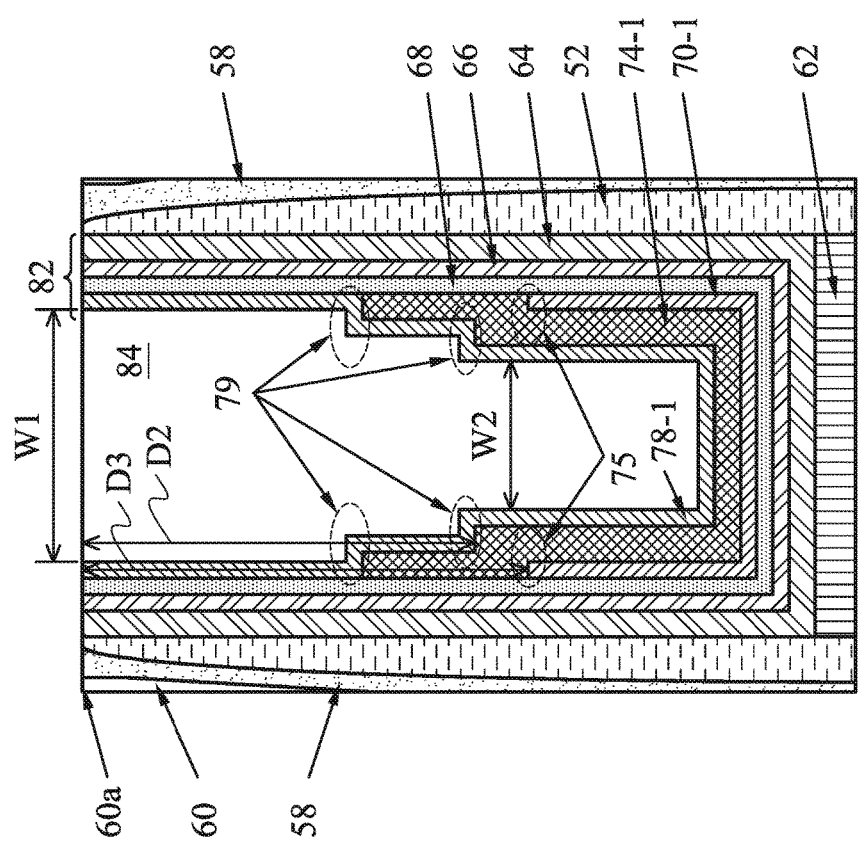

FIG. 30 shows an enlarged view of the gate structure formed in FIG. 29. In the example shown in FIG. 30, first depth D1 (which is a measure of the extent to which layered structure 82 is recessed with respect to the top surface 60a of ILD0 60) may be about 0 nm (e.g. since layered structure 82 is substantially co-planar with ILD0 60). In the example shown in FIG. 30, second depth D2 may be between about 100 nm to about 1000 nm, while third depth D3 may be between about 200 nm to about 2000 nm. The process flow may proceed from FIG. 29 in a similar manner as depicted above in respect of FIG. 26. In particular, dielectric caps 88 may be formed over gate structure including conductive material 84 and layered structures 82, while ILD1 90 may be formed over ILD0 60. Contacts 92 are subsequently formed through the ILD1 90, ILD0 60, and ESL 58 to the epitaxial source/drain regions 54 and 56.

Some embodiments may achieve advantages. By forming work function tuning layers that have sidewalls with stair-step-like increments, voids, caused when openings are filled with conductive material, are avoided or substantially reduced. As such, the stair-step-like increments of work function tuning layers allow for a uniform filling of the openings when a conductive material (e.g. that forms a gate structure) is deposited into the openings. Furthermore, since voids may be avoided or substantially reduced, damage to a channel region (e.g. in a fin) may be avoided or substantially reduced during an etch back of the conductive material.

In an embodiment, a method may include forming an opening through an insulating layer and forming a first work function metal layer in the opening. The method further includes recessing the first work function metal layer into the opening to form a recessed first work function metal layer. A second work function metal layer in the opening and over the first work function metal layer. The second work function metal layer lines and overhangs the recessed first work function metal layer.

In an embodiment, a method may include forming an opening in an inter-layer dielectric, which may be disposed over a substrate. The method further includes forming a first work function tuning layer in the opening and etching the first work function tuning layer to form a recessed first work function tuning layer in the opening. The method also includes forming a second work function tuning layer along the recessed first work function tuning layer in the opening and exposed surfaces of the opening. The method additionally includes etching the second work function tuning layer to form a recessed second work function tuning layer, where the recessed second work function tuning layer lines and overhangs the recessed first work function tuning layer, and where the recessed second work function tuning layer further lines a portion of the opening proximal the substrate. The method also includes forming an electrode over the recessed second work function tuning layer and in the opening.

In an embodiment, a structure may include a first source/drain region and a second source/drain region in a substrate. The structure further includes a gate structure over the substrate and disposed between the first source/drain region and the second source/drain region. The gate structure includes a gate dielectric, a gate electrode; and a work function tuning structure disposed between the gate dielectric and the gate electrode. The work function tuning structure has sidewalls separated by a first dimension distal the substrate and by a second dimension, less than the first dimension, proximal the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an opening through an insulating layer;
   forming a first work function metal layer in the opening;
   recessing the first work function metal layer into the opening to remove an upper portion of the first work function metal layer, wherein a lower portion of the first work function metal layer remaining within the opening after the recessing forms a recessed first work function metal layer; and
   forming a second work function metal layer in the opening and over the recessed first work function metal layer, the second work function metal layer lining and overhanging the recessed first work function metal layer.

2. The method of claim 1, wherein the opening defines a position of a gate structure of a transistor.

3. The method of claim 1, further comprising:
   recessing the second work function metal layer into the opening to remove an upper portion of the second work function metal layer, wherein a lower portion of the second work function metal layer remaining within the opening after the recessing forms a recessed second work function metal layer, the recessed second work function metal layer lining and overhanging the recessed first work function metal layer.

4. The method of claim 3, further comprising:
   filling the opening with a conductive material, the conductive material covering the recessed first work function metal layer and the recessed second work function metal layer.

5. The method of claim 1, wherein the forming the opening through the insulating layer comprises:
   forming a dummy gate structure over a substrate;
   forming a gate spacer along opposing sidewalls of the dummy gate structure;
   removing the dummy gate structure to form a recess;
   forming a gate dielectric in the recess; and
   forming a barrier layer over the gate dielectric, the barrier layer defining a sidewall of the opening.

6. The method of claim 5, wherein the recessing the first work function metal layer into the opening comprises etching the first work function metal layer using the barrier layer as an etch stop layer.

7. The method of claim 1, wherein the recessing the first work function metal layer into the opening comprises:
   filling the opening with a mask, the mask overlying the insulating layer;
   recessing the mask into the opening to expose the upper portion of the first work function metal layer, the mask covering the lower portion of the first work function metal layer; and removing the exposed upper portion of the first work function metal layer.

8. The method of claim 7, wherein the removing the exposed upper portion of the first work function metal layer comprises an etch process selective to a material of the first work function metal layer.

9. A method, comprising:
forming an opening in an inter-layer dielectric, the inter-layer dielectric disposed over a substrate;
forming a first work function tuning layer in the opening;
etching the first work function tuning layer to remove an upper portion of the first work function tuning layer, wherein a lower portion of the first work function tuning layer remaining within the opening after the etching forms a recessed first work function tuning layer in the opening;
forming a second work function tuning layer along the recessed first work function tuning layer and exposed surfaces of the opening;
etching the second work function tuning layer to remove an upper portion of the second work function tuning layer, wherein a lower portion of the second work function tuning layer remaining within the opening after the etching forms a recessed second work function tuning layer, the recessed second work function tuning layer lining and overhanging the recessed first work function tuning layer; and
forming an electrode over the recessed second work function tuning layer and in the opening.

10. The method of claim 9, wherein the electrode comprises a metal gate electrode.

11. The method of claim 9, further comprising:
forming a third work function tuning layer along the recessed second work function tuning layer in the opening and exposed surfaces of the opening; and
etching the third work function tuning layer to remove an upper portion of the third work function tuning layer, wherein a lower portion of the third work function tuning layer remaining within the opening after the etching forms a recessed third work function tuning layer, the recessed third work function tuning layer lining and overhanging the recessed second work function tuning layer.

12. The method of claim 9, wherein the forming the opening in the inter-layer dielectric comprises:
forming a dummy gate structure over the substrate;
forming a first source/drain region and second source/drain region in the substrate and on opposing sides of the dummy gate structure;
forming an inter-layer dielectric over the substrate and around the dummy gate structure;
forming a recess through the inter-layer dielectric by removing the dummy gate structure; and
forming a layered structure in the recess, the layered structure comprising a gate dielectric layer along sidewalls and a bottom surface of the recess, and a capping layer along the gate dielectric layer, the capping layer defining the opening.

13. The method of claim 9, wherein forming the first work function tuning layer comprises a deposition process.

14. The method of claim 9, wherein the etching the second work function tuning layer comprises:
depositing an etch mask in the opening and over a major surface of the inter-layer dielectric directed away from the substrate;
recessing the etch mask into the opening to form a recessed etch mask, the recessed etch mask exposing the upper portion of the second work function tuning layer in the opening, and covering an overhang of the second work function tuning layer; and
etching exposed upper portions of the second work function tuning layer using the etch mask as a mask.

15. A method, comprising:
forming an opening in an inter-layer dielectric, the inter-layer dielectric disposed over a substrate, the opening extending between a first source/drain region and a second source/drain region in the substrate;
depositing a first work function tuning layer in the opening;
etching the first work function tuning layer to remove an upper portion of the first work function tuning layer forming a recessed first work function tuning layer in the opening, wherein a lower portion of the first work function tuning layer remains within the opening after the etching;
depositing a second work function tuning layer over the recessed first work function tuning layer and exposed surfaces of the opening;
etching the second work function tuning layer to remove an upper portion of the second work function tuning layer forming a recessed second work function tuning layer, wherein a lower portion of the second work function tuning layer remains within the opening after the etching, wherein the recessed second work function tuning layer lines and extends above the recessed first work function tuning layer; and
depositing an electrode over the recessed second work function tuning layer, the electrode filling the opening.

16. The method of claim 15, further comprising:
depositing a third work function tuning layer over the recessed second work function tuning layer and exposed surfaces of the opening;
etching the third work function tuning layer to remove an upper portion of the third work function tuning layer forming a recessed third work function tuning layer, wherein a lower portion of the third work function tuning layer remains within the opening after the etching, wherein the recessed third work function tuning layer lines and extends above the recessed second work function tuning layer.

17. The method of claim 16, wherein a topmost surface of the recessed third work function tuning layer is disposed below a topmost surface of the inter-layer dielectric.

18. The method of claim 17, further comprising etching back the electrode such that a topmost surface of the electrode is coplanar with the topmost surface of the recessed third work function tuning layer.

19. The method of claim 16, wherein sidewalls of the opening are defined by a capping layer, wherein a topmost surface of the capping layer, a topmost surface of the recessed third work function tuning layer, and a top surface of the electrode are level with one another.

20. The method of claim 15, further comprising planarizing the electrode such that a topmost surface of the electrode is coplanar with a topmost surface of the inter-layer dielectric.

* * * * *